United States Patent
Endo et al.

(10) Patent No.: US 11,385,546 B2
(45) Date of Patent: Jul. 12, 2022

(54) MULTI-LEVEL SUBSTRATE COATING FILM-FORMING COMPOSITION CONTAINING PLASMA-CURABLE COMPOUND BASED ON UNSATURATED BONDS BETWEEN CARBON ATOMS

(71) Applicant: NISSAN CHEMICAL CORPORATION, Tokyo (JP)

(72) Inventors: Takafumi Endo, Toyama (JP); Hikaru Tokunaga, Toyama (JP); Keisuke Hashimoto, Toyama (JP); Rikimaru Sakamoto, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 283 days.

(21) Appl. No.: 16/605,440

(22) PCT Filed: Apr. 11, 2018

(86) PCT No.: PCT/JP2018/015268
§ 371 (c)(1),
(2) Date: Oct. 15, 2019

(87) PCT Pub. No.: WO2018/190380
PCT Pub. Date: Oct. 18, 2018

(65) Prior Publication Data
US 2020/0124966 A1    Apr. 23, 2020

(30) Foreign Application Priority Data

Apr. 14, 2017 (JP) ............................. JP2017-080826

(51) Int. Cl.
*G03F 7/11* (2006.01)
*G03F 7/16* (2006.01)
(Continued)

(52) U.S. Cl.
CPC ................ *G03F 7/11* (2013.01); *G03F 7/167* (2013.01); *G03F 7/26* (2013.01); *H01L 21/31058* (2013.01)

(58) Field of Classification Search
CPC .............. G03F 7/11; G03F 7/167; G03F 7/26; G03F 7/094; G03F 7/004; G03F 1/80;
(Continued)

(56) References Cited

U.S. PATENT DOCUMENTS 6,962,769 B2    11/2005  Shao et al.
2004/0048196 A1   3/2004  Shao et al.
(Continued)

FOREIGN PATENT DOCUMENTS

JP    2004-533637 A    11/2004
JP    2007-078890 A     3/2007
(Continued)

OTHER PUBLICATIONS

Jun. 19, 2018 Search Report issued in International Patent Application No. PCT/JP2018/015268.
(Continued)

*Primary Examiner* — Caleen O Sullivan
(74) *Attorney, Agent, or Firm* — Oliff PLC

(57) ABSTRACT

There are provided a plasma-curable multi-level substrate coating film-forming composition for forming a coating film having planarity on a substrate, wherein the composition can fill a pattern sufficiently. A plasma-curable multi-level substrate coating film-forming composition comprising a compound (E) and a solvent (F), wherein the compound (E) has at least one partial structure selected from partial structures (I) of the following Formulae (1-1) to (1-7):

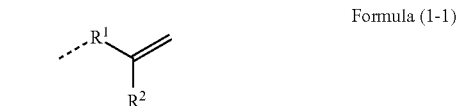

Formula (1-1)

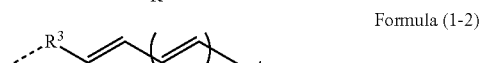

Formula (1-2)

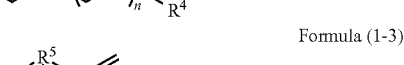

Formula (1-3)

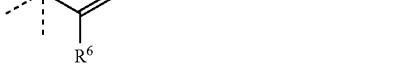

Formula (1-4)

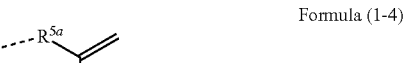

Formula (1-5)

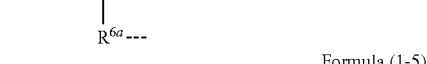

Formula (1-6)

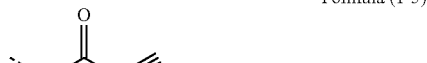

Formula (1-7)

wherein $R^1$, $R^{1a}$, $R^3$, $R^{5a}$, and $R^{6a}$ are each independently a $C_{1-10}$ alkylene group, a $C_{6-40}$ arylene group (the alkylene group and the arylene group are optionally substituted with one or more amide or amino groups), an oxygen atom, a carbonyl group, a sulfur atom, —C(O)—NR$^a$—, —NR$^b$—, or a divalent group composed of any combination of these; $R^5$ is each independently a nitrogen atom, or a trivalent group composed of a combination of a nitrogen atom and at
(Continued)

least one group selected from the group consisting of a $C_{1-10}$ alkylene group, a $C_{6-40}$ arylene group (the alkylene group and the arylene group are optionally substituted with one or more amide or amino groups), an oxygen atom, a carbonyl group, a sulfur atom, —C(O)—NR$^a$—, and —NR$^b$—; $R^2$, $R^{2a}$, $R^4$, and $R^6$ are each independently a hydrogen atom, a $C_{1-10}$ alkyl group, or a monovalent group composed of a combination of a hydrogen atom and at least one group selected from the group consisting of a $C_{1-10}$ alkylene group, an oxygen atom, a carbonyl group, —C(O)—NR$^a$—, and —NR$^b$—; $R^a$ is a hydrogen atom or a $C_{1-10}$ alkyl group; $R^b$ is a hydrogen atom, a $C_{1-10}$ alkyl group, or a $C_{1-10}$ alkyl-carbonyl group; n is a number of repeating units of 1 to 10; and a dotted line is a chemical bond to the adjacent atom.

21 Claims, No Drawings

(51) Int. Cl.
   *H01L 21/3105* (2006.01)
   *G03F 7/26* (2006.01)
(58) Field of Classification Search
   CPC ............ G03F 7/025; G03F 7/027; G03F 7/22; G03F 7/38; H01L 21/31058; H01L 21/0271; H01L 21/027; H01L 21/3065
   USPC .......................................................... 430/296
   See application file for complete search history.

(56) References Cited

U.S. PATENT DOCUMENTS

| | | | |
|---|---|---|---|
| 2011/0230058 A1* | 9/2011 | Sakamoto | ............... G03F 7/093 438/763 |
| 2014/0170855 A1* | 6/2014 | Nakajima | ............. C07F 7/1804 438/703 |

FOREIGN PATENT DOCUMENTS

| | | |
|---|---|---|
| JP | 2012-186373 A | 9/2012 |
| WO | 2006/115044 A1 | 11/2006 |
| WO | 2007/066597 A1 | 6/2007 |
| WO | 2008/047638 A1 | 4/2008 |
| WO | 2009/008446 A1 | 1/2009 |
| WO | 2010/061774 A1 | 6/2010 |
| WO | 2013/022099 A1 | 2/2013 |

OTHER PUBLICATIONS

Jun. 19, 2018 Written Opinion of the International Searching Authority issued in International Patent Application No. PCT/JP2018/015268.

* cited by examiner

MULTI-LEVEL SUBSTRATE COATING FILM-FORMING COMPOSITION CONTAINING PLASMA-CURABLE COMPOUND BASED ON UNSATURATED BONDS BETWEEN CARBON ATOMS

TECHNICAL FIELD

The present invention relates to a multi-level substrate coating film-forming composition for forming a planarization film on a multi-level substrate by plasma irradiation, and to a method for producing a laminated substrate that is planarized by using the multi-level substrate coating film-forming composition.

BACKGROUND ART

In recent years, semiconductor integrated circuit devices have been processed with a fine design rule. Exposure light having a shorter wavelength must be used for formation of a finer resist pattern by an optical lithography technique.

However, the depth of focus decreases in association with the use of exposure light having a shorter wavelength, and thus the planarity of a coating film formed on a substrate must be improved. A technique for planarization of the film on the substrate has become important for the production of a semiconductor device having a fine design rule.

Hitherto disclosed planarization film formation methods include, for example, a method for forming a resist underlayer film below a resist by photocuring.

A resist underlayer film-forming composition has been disclosed which contains a polymer having an epoxy group or an oxetane group in a side chain and a photo-cationic polymerization initiator, or contains a polymer having a radical polymerizable ethylenically unsaturated bond and a photo-radical polymerization initiator (see Patent Document 1).

A resist underlayer film-forming composition has been disclosed which contains a silicon-containing compound having cationic polymerizable reactive groups (e.g., an epoxy group and a vinyl group), a photo-cationic polymerization initiator, and a photo-radical polymerization initiator (see Patent Document 2).

A method for producing a semiconductor device has been disclosed, in which the device includes a resist underlayer film containing a polymer having a crosslinkable functional group (e.g., a hydroxy group) in a side chain, a crosslinking agent, and a photoacid generator (see Patent Document 3).

A resist underlayer film having an unsaturated bond in a main or side chain, which is not a photo-crosslinked resist underlayer film, has been disclosed (see Patent Documents 4 and 5).

PRIOR ART DOCUMENTS

Patent Documents

Patent Document 1: International Publication Pamphlet WO 2006/115044
Patent Document 2: International Publication Pamphlet WO 2007/066597
Patent Document 3: International Publication Pamphlet WO 2008/047638
Patent Document 4: International Publication Pamphlet WO 2009/008446
Patent Document 5: Japanese Patent Application Publication (Translation of PCT Application) No. 2004-533637 (JP 2004-533637 A)

SUMMARY OF THE INVENTION

Problems to be Solved by the Invention

A conventional photo-crosslinkable material, for example, a resist underlayer film-forming composition containing a polymer having a thermally crosslink forming functional group such as a hydroxy group, a crosslinking agent, and an acid catalyst (acid generator) may pose the following problem. Specifically, when the composition is heated to fill a pattern (e.g., a hole or a trench structure) formed on a substrate, a crosslinking reaction proceeds, leading to an increase in viscosity, resulting in insufficient filling of the pattern with the composition. The composition may also pose a problem in terms of planarity due to occurrence of thermal shrinkage caused by degassing.

Meanwhile, a resist underlayer film-forming composition containing a polymer having cationic polymerizable reactive groups (e.g., an epoxy group and a vinyl group) and an acid generator may pose a problem in terms of planarity due to occurrence of thermal shrinkage caused by degassing during photoirradiation and heating.

An object of the present invention is to provide a plasma-curable multi-level substrate coating film-forming composition for forming a coating film having planarity on a substrate, wherein the composition can fill a pattern sufficiently and can form a coating film without causing degassing or thermal shrinkage.

Means for Solving the Problems

A first aspect of the present invention is a plasma-curable multi-level substrate coating film-forming composition comprising a compound (E) and a solvent (F), wherein the compound (E) has at least one partial structure selected from partial structures (I) of the following Formulae (1-1) to (1-7):

Formula (1-1)

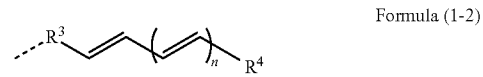

Formula (1-2)

Formula (1-3)

Formula (1-4)

Formula (1-5)

Formula (1-6)

Formula (1-7)

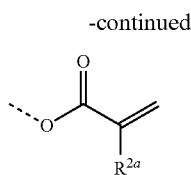

(wherein $R^1$, $R^{1a}$, $R^3$, $R^{5a}$, and $R^{6a}$ are each independently a $C_{1-10}$ alkylene group, a $C_{6-40}$ arylene group (the alkylene group and the arylene group are optionally substituted with one or more amide or amino groups), an oxygen atom, a carbonyl group, a sulfur atom, —C(O)—$NR^a$—, —$NR^b$—, or a divalent group composed of any combination of these; $R^5$ is each independently a nitrogen atom, or a trivalent group composed of a combination of a nitrogen atom and at least one group selected from the group consisting of a $C_{1-10}$ alkylene group, a $C_{6-40}$ arylene group (the alkylene group and the arylene group are optionally substituted with one or more amide or amino groups), an oxygen atom, a carbonyl group, a sulfur atom, —C(O)—$NR^a$—, and —$NR^b$—; $R^2$, $R^{2a}$, $R^4$, and $R^6$ are each independently a hydrogen atom, a $C_{1-10}$ alkyl group, or a monovalent group composed of a combination of a hydrogen atom and at least one group selected from the group consisting of a $C_{1-10}$ alkylene group, an oxygen atom, a carbonyl group, —C(O)—$NR^a$—, and —$NR^b$—; $R^a$ is a hydrogen atom or a $C_{1-10}$ alkyl group; $R^b$ is a hydrogen atom, a $C_{1-10}$ alkyl group, or a $C_{1-10}$ alkylcarbonyl group; n is a number of repeating units of 1 to 10; and a dotted line is a chemical bond to the adjacent atom).

A second aspect of the present invention is the plasma-curable multi-level substrate coating film-forming composition according to the first aspect, wherein $R^{5a}$ and $R^{6a}$ are each a $C_{1-10}$ alkylene group, a $C_{6-40}$ arylene group, an oxygen atom, a carbonyl group, a sulfur atom, or a divalent group composed of any combination of these.

A third aspect of the present invention is the plasma-curable multi-level substrate coating film-forming composition according to the first or second aspect, wherein the compound (E) is a compound (1) prepared by reaction between a proton-generating compound (A) having an unsaturated bond between carbon atoms and an epoxy compound (B); a compound (2) prepared by reaction between an epoxy compound (C) having an unsaturated bond between carbon atoms and a proton-generating compound (D); or a compound (3) prepared by reaction between a compound having a hydroxy group and a compound (G) having an unsaturated bond and being capable of reacting with the hydroxy group, the hydroxy group being generated by reaction between the epoxy compound (B) or the epoxy compound (C) having an unsaturated bond between carbon atoms and the proton-generating compound (A) having an unsaturated bond between carbon atoms or the proton-generating compound (D).

A fourth aspect of the present invention is the plasma-curable multi-level substrate coating film-forming composition according to the third aspect, wherein the compound (E) is a reaction product between the proton-generating compound (A) and the epoxy compound (B) in which the ratio by mole of the proton of the proton-generating compound (A) to the epoxy group of the epoxy compound (B) is 1:1 to 1:1.5.

A fifth aspect of the present invention is the plasma-curable multi-level substrate coating film-forming composition according to the third aspect, wherein the compound (E) is a reaction product between the epoxy compound (C) and the proton-generating compound (D) in which the ratio by mole of the epoxy group of the epoxy compound (C) to the proton of the proton-generating compound (D) is 1:1 to 1.5:1.

A sixth aspect of the present invention is the plasma-curable multi-level substrate coating film-forming composition according to the third or fourth aspect, wherein the proton-generating compound (A) having an unsaturated bond between carbon atoms is a carboxylic acid having an unsaturated bond between carbon atoms, an acid anhydride having an unsaturated bond between carbon atoms, an amine having an unsaturated bond between carbon atoms, an amide having an unsaturated bond between carbon atoms, an isocyanurate having an unsaturated bond between carbon atoms, phenol having an unsaturated bond between carbon atoms, or a thiol having an unsaturated bond between carbon atoms.

A seventh aspect of the present invention is the plasma-curable multi-level substrate coating film-forming composition according to the third or fourth aspect, wherein the epoxy compound (B) is a glycidyl group-containing ether, a reaction product between a phenolic hydroxy group-containing compound and epichlorohydrin, a reaction product between a phenolic hydroxy group-containing resin and epichlorohydrin, a glycidyl group-containing isocyanurate, an epoxycyclohexyl group-containing compound, an epoxy group-substituted cyclohexyl compound, or a glycidyl ester compound.

An eighth aspect of the present invention is the plasma-curable multi-level substrate coating film-forming composition according to the third or fifth aspect, wherein the epoxy compound (C) having an unsaturated bond between carbon atoms is a glycidyl ester compound having an unsaturated bond between carbon atoms, a reaction product between epichlorohydrin and a phenolic hydroxy group-containing compound having an unsaturated bond between carbon atoms, or a reaction product between epichlorohydrin and a phenolic hydroxy group-containing resin having an unsaturated bond between carbon atoms.

A ninth aspect of the present invention is the plasma-curable multi-level substrate coating film-forming composition according to the third or fifth aspect, wherein the proton-generating compound (D) is a phenolic hydroxy group-containing compound, a carboxylic acid-containing compound, an amine-containing compound, a thiol-containing compound, or an imide-containing compound.

A tenth aspect of the present invention is the plasma-curable multi-level substrate coating film-forming composition according to the third or fifth aspect, wherein the compound (G) is an acid halogenide, acid anhydride, isocyanate, or alkyl halide having an unsaturated bond between carbon atoms, or the proton-generating compound (A).

An eleventh aspect of the present invention is the plasma-curable multi-level substrate coating film-forming composition according to any one of the first to tenth aspects, wherein the plasma is generated through irradiation of a plasma gas used as an etching gas.

A twelfth aspect of the present invention is the plasma-curable multi-level substrate coating film-forming composition according to any one of the first to tenth aspects, wherein the plasma is a halogen-containing gas plasma, an oxygen gas plasma, or a hydrogen gas plasma.

A thirteenth aspect of the present invention is the plasma-curable multi-level substrate coating film-forming composition according to any one of the first to twelfth aspects, wherein the multi-level substrate coating film-forming composition is a resist underlayer film-forming composition used in a lithography process for producing a semiconductor device.

A fourteenth aspect of the present invention is a method for producing a coated substrate, the method comprising a step (i) of applying the plasma-curable multi-level substrate coating film-forming composition according to any one of the first to thirteenth aspects to a multi-level substrate; and a step (ii) of irradiating the multi-level substrate with a plasma.

A fifteenth aspect of the present invention is the method for producing a coated substrate according to the fourteenth aspect, wherein the method further comprises a step (ia) of heating the plasma-curable multi-level substrate coating film-forming composition at a temperature of 70 to 400° C. for 10 seconds to five minutes after application of the composition in the step (i).

A sixteenth aspect of the present invention is the method for producing a coated substrate according to the fourteenth or fifteenth aspect, wherein the plasma irradiation in the step (ii) is performed with a fluorine-containing gas or a gas mixture of oxygen and an inert gas.

A seventeenth aspect of the present invention is the method for producing a coated substrate according to any one of the fourteenth and fifteenth aspects, wherein the plasma irradiation in the step (ii) is performed with an etching gas by using an apparatus used in a dry etching process.

An eighteenth aspect of the present invention is the method for producing a coated substrate according to any one of the fourteenth to seventeenth aspects, wherein the substrate has an open area (non-patterned area) and a patterned area of DENCE (dense) and ISO (coarse), and the pattern has an aspect ratio of 0.1 to 10.

A nineteenth aspect of the present invention is the method for producing a coated substrate according to the eighteenth aspect, wherein the difference in coating level (Bias) between the open area and the patterned area is 1 to 50 nm.

A twentieth aspect of the present invention is a method for producing a semiconductor device, the method comprising a step of forming, on a multi-level semiconductor substrate, an underlayer film from the multi-level substrate coating film-forming composition according to any one of the first to thirteenth aspects; a step of forming a resist film on the underlayer film; a step of irradiating the resist film with light or electron beams, and developing the resist film, to thereby form a resist pattern; a step of etching the underlayer film with the resist pattern; and a step of processing the semiconductor substrate with the patterned underlayer film.

A twenty-first aspect of the present invention is the method for producing a semiconductor device according to the twentieth aspect, wherein the multi-level substrate is the substrate according to the eighteenth aspect.

A twenty-second aspect of the present invention is the method for producing a semiconductor device according to the twentieth aspect, wherein the step of forming an underlayer film from the multi-level substrate coating film-forming composition is performed by the method according to any one of the fourteenth to nineteenth aspects.

A twenty-third aspect of the present invention is the method for producing a semiconductor device according to the twentieth aspect, wherein the underlayer film formed from the multi-level substrate coating film-forming composition has the difference in coating level according to the nineteenth aspect.

A twenty-fourth aspect of the present invention is a method for producing a semiconductor device, the method comprising a step of forming, on a multi-level semiconductor substrate, an underlayer film from the plasma-curable multi-level substrate coating film-forming composition according to any one of the first to thirteenth aspects; a step of forming a hard mask on the underlayer film; a step of forming a resist film on the hard mask; a step of irradiating the resist film with light or electron beams, and developing the resist film, to thereby form a resist pattern; a step of etching the hard mask with the resist pattern; a step of etching the underlayer film with the patterned hard mask; and a step of processing the semiconductor substrate with the patterned underlayer film.

A twenty-fifth aspect of the present invention is the method for producing a semiconductor device according to the twenty-fourth aspect, wherein the multi-level substrate is the substrate according to the eighteenth aspect.

A twenty-sixth aspect of the present invention is the method for producing a semiconductor device according to the twenty-fourth aspect, wherein the step of forming an underlayer film from the multi-level substrate coating film-forming composition is performed by the method according to any one of the fourteenth to nineteenth aspects.

A twenty-seventh aspect of the present invention is the method for producing a semiconductor device according to the twenty-fourth aspect, wherein the underlayer film formed from the multi-level substrate coating film-forming composition has the difference in coating level according to the nineteenth aspect.

Effects of the Invention

The multi-level substrate coating film-forming composition of the present invention is applied onto a substrate, and optionally reflowed by further heating, so that a pattern is filled with the composition. Since the multi-level substrate coating film-forming composition does not contain a thermally crosslinkable moiety or an acid catalyst, the viscosity of the composition does not increase during heating. Thus, a flat film is formed on the substrate regardless of an open area (non-patterned area) or a patterned area of DENCE (dense) and ISO (coarse) on the substrate. Subsequently, a crosslinked structure is formed between carbon-carbon unsaturated bonds by radical species generated through irradiation of the unsaturated bonds with a plasma. Since the multi-level substrate coating film-forming composition of the present invention contains neither a crosslinking agent nor an acid catalyst, a crosslinked structure can be formed by reaction between carbon-carbon unsaturated bonds (e.g., carbon-carbon double or triple bonds) in a multi-level substrate coating film (planarization film) formed through application of the multi-level substrate coating film-forming composition.

In the multi-level substrate coating film (planarization film) formed from the multi-level substrate coating film-forming composition of the present invention, no crosslinking reaction occurs during thermal reflow because of the absence of a crosslinking agent and an acid catalyst. Subsequent crosslinking by plasma irradiation (i.e., plasma reaction associated with no degassing) does not cause thermal shrinkage in the multi-level substrate coating film. Thus, the present invention provides a multi-level substrate coating film-forming composition that can achieve sufficient filling of a pattern and good planarity after filling of the pattern, to thereby form an excellent planarization film.

MODES FOR CARRYING OUT THE INVENTION

The present invention is directed to a plasma-curable multi-level substrate coating film-forming composition containing a compound (E) having at least one partial structure selected from partial structures (I) and a solvent (F).

The plasma is generated through irradiation of a plasma gas used as an etching gas for resist pattern etching.

The plasma may be a halogen-containing gas plasma, an oxygen gas plasma, or a hydrogen gas plasma alone.

The plasma may be a plasma of a gas mixture containing gases selected from a halogen-containing gas, oxygen, and hydrogen, or may be a plasma of a gas mixture containing the aforementioned gases and an additional gas.

Examples of the halogen include fluorine and chlorine. Examples of the halogen-containing gas include tetrafluoromethane ($CF_4$), perfluorocyclobutane ($C_4F_8$), perfluoropropane ($C_3F_8$), trifluoromethane ($CHF_3$), difluoromethane ($CH_2F_2$), nitrogen trifluoride, sulfur hexafluoride, chlorine trifluoride, chlorine, trichloroborane, and dichloroborane.

Examples of the additional gas include an inert gas and carbon monoxide. Examples of the inert gas include nitrogen gas, helium gas, and argon gas.

The aforementioned plasma gas can be preferably a plasma of tetrafluoromethane ($CF_4$) or a plasma of a gas mixture of oxygen and nitrogen.

The partial structure (I) is at least one selected from partial structures of Formulae (1-1) to (1-7).

The partial structure (1) may be, for example, the partial structure of Formula (1-1), the partial structure of Formula (1-2), the partial structure of Formula (1-3), the partial structure of Formula (1-4), the partial structure of Formula (1-5), a combination of the partial structure of Formula (1-6) and the partial structure of Formula (1-7), a combination of the partial structure of Formula (1-1) and the partial structure of Formula (1-3), or a combination of the partial structure of Formula (1-1) and the partial structure of Formula (1-4).

In the aforementioned Formulae, $R^1$, $R^{1a}$, $R^3$, $R^{5a}$, and $R^{6a}$ are each independently a $C_{1-10}$ alkylene group, a $C_{6-40}$ arylene group (the alkylene group and the arylene group are optionally substituted with one or more amide or amino groups), an oxygen atom, a carbonyl group, a sulfur atom, —C(O)—$NR^a$—, —$NR^b$—, or a divalent group composed of any combination of these; $R^5$ is each independently a nitrogen atom, or a trivalent group composed of a combination of a nitrogen atom and at least one group selected from the group consisting of a $C_{1-10}$ alkylene group, a $C_{6-40}$ arylene group (the alkylene group and the arylene group are optionally substituted with one or more amide or amino groups), an oxygen atom, a carbonyl group, a sulfur atom, —C(O)—$NR^a$—, and —$NR^b$—; $R^2$, $R^{2a}$, $R^4$, and $R^6$ are each independently a hydrogen atom, a $C_{1-10}$ alkyl group, or a monovalent group composed of a combination of a hydrogen atom and at least one group selected from the group consisting of a $C_{1-10}$ alkylene group, an oxygen atom, a carbonyl group, —C(O)—$NR^a$—, and —$NR^b$—; $R^a$ is a hydrogen atom or a $C_{1-10}$ alkyl group; $R^b$ is a hydrogen atom, a $C_{1-10}$ alkyl group, or a $C_{1-10}$ alkylcarbonyl group; n is a number of repeating units of 1 to 10; and a dotted line is a chemical bond to the adjacent atom.

In the aforementioned Formulae, each of $R^{5a}$ and $R^{6a}$ may be a $C_{1-10}$ alkylene group, a $C_{6-40}$ arylene group, an oxygen atom, a carbonyl group, a sulfur atom, or a divalent group composed of any combination of these.

The multi-level substrate coating film-forming composition may optionally contain an additive such as a surfactant.

The composition has a solid content of 0.1 to 70% by mass, 0.1 to 60% by mass, 0.2 to 30% by mass, or 0.3 to 15% by mass. The "solid content" as used herein corresponds to the total amount of all components of the multi-level substrate coating film-forming composition, except for the amount of the solvent. The amount of the compound (E) in the solid content may be 1 to 100% by mass, 1 to 99.9% by mass, 50 to 99.9% by mass, 50 to 95% by mass, or 50 to 90% by mass.

The compound (E) used in the present invention has an average molecular weight of 600 to 1,000,000, 600 to 200,000, or 1,500 to 15,000.

In the compound (E), a crosslinked structure can be formed by intermolecular or intramolecular plasma reaction of carbon-carbon unsaturated bonds. The compound (E) may have at least one unsaturated bond between carbon atoms (i.e., unsaturated double bond between carbon atoms) in the molecule, or may have a plurality of (e.g., 1 to 1,000) carbon-carbon unsaturated bonds in the molecule.

The aforementioned alkyl group is a $C_{1-10}$ alkyl group. Examples of the alkyl group include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, l-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

The aforementioned aryl group is $C_{6-40}$ aryl group. Examples of the aryl group include phenyl group, biphenyl group, terphenylene group, fluorene group, naphthyl group, anthryl group, pyrene group, and carbazole group.

The aforementioned alkylene group is, for example, a divalent organic group derived from any of the aforementioned alkyl groups.

The aforementioned arylene group is, for example, a divalent organic group derived from any of the aforementioned aryl groups.

The aforementioned alkylcarbonyl group is, for example, a group prepared through bonding of a carbonyl group to any of the aforementioned alkyl groups.

In Formula (1-4) of the partial structure (I), each of $R^{5a}$ and $R^{6a}$ may be independently a $C_{1-10}$ alkylene group, a $C_{6-40}$ arylene group, an oxygen atom, a carbonyl group, a sulfur atom, or a divalent group composed of any combination of these.

The partial structure of Formula (1-4) among the partial structures (I) is bonded to a partial structure of Formula (II), to thereby form a chain polymer. When each of $R^{5a}$ and $R^{6a}$ is composed of any of the aforementioned groups, a cross-linked structure can be effectively formed by plasma reaction, which is preferred.

The compound (E) may have the partial structure (I) and a partial structure (II).

The partial structure (II) is a partial structure of the following Formula (2-1) or (2-2) and has a hydroxy group.

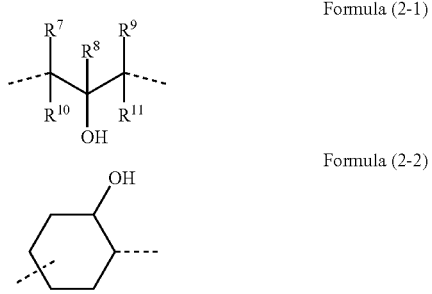

Formula (2-1)

Formula (2-2)

In Formulae (2-1) and (2-2), $R^7$, $R^8$, $R^9$, $R^{10}$, and $R^{11}$ are each a hydrogen atom or a $C_{1-10}$ alkyl group, and a dotted line is a chemical bond to the adjacent atom.

The compound (E) may be a compound (1) prepared by reaction between a proton-generating compound (A) having an unsaturated bond between carbon atoms and an epoxy compound (B); a compound (2) prepared by reaction between an epoxy compound (C) having an unsaturated bond between carbon atoms and a proton-generating compound (D); or a compound (3) prepared by reaction between a compound having a hydroxy group and a compound (G) having an unsaturated bond and being capable of reacting with the hydroxy group, the hydroxy group being generated by reaction between the epoxy compound (B) or the epoxy compound (C) having an unsaturated bond between carbon atoms and the proton-generating compound (A) having an unsaturated bond between carbon atoms or the proton-generating compound (D).

The partial structure (II) contains a hydroxyl group generated by reaction between an epoxy group and a proton-generating compound. The compound (E) may contain an epoxy group and a hydroxy group at a ratio by mole satisfying the relation: 0≤(epoxy group)/(hydroxyl group) ≤0.5. When the epoxy compound (B) or (C) is reacted with the proton-generating compound (A) or (D), addition reaction occurs at the epoxy group to thereby generate a hydroxyl group. The addition reaction is performed so as to satisfy the relation: 0≤(epoxy group)/(hydroxyl group)≤0.5 in terms of ratio by mole. The amount of the remaining epoxy group is preferably small. The amount of the remaining epoxy group in the compound (E) is preferably zero or nearly zero in view of photoreactivity.

The compound (E) may be prepared by reaction between the proton-generating compound (A) and the epoxy compound (B) wherein the ratio by mole of the proton of the proton-generating compound (A) to the epoxy group of the epoxy compound (B) is 1:1 to 1:1.5.

The compound (E) may be prepared by reaction between the epoxy compound (C) and the proton-generating compound (D) wherein the ratio by mole of the epoxy group of the epoxy compound (C) to the proton of the proton-generating compound (D) is 1:1 to 1.5:1.

The partial structure (I) and the partial structure (11) are formed by reaction between the proton-generating group of the proton-generating compound (A) and the epoxy group of the epoxy compound (B). Any of the oxygen atoms of $R^1$, $R^3$, $R^5$, $R^{5a}$, $R^{6a}$, $R^{1a}$, and the ester group in the partial structure (I) forms a bond with the carbon atom between $R^7$ and $R^{10}$, the carbon atom between $R^9$ and $R^{11}$, or the carbon atom in the hydroxycyclohexyl ring in the partial structure (II).

The proton-generating compound (A) having an unsaturated bond between carbon atoms may be, for example, a carboxylic acid having an unsaturated bond between carbon atoms, an acid anhydride having an unsaturated bond between carbon atoms, an amine having an unsaturated bond between carbon atoms, an amide having an unsaturated bond between carbon atoms, an isocyanurate having an unsaturated bond between carbon atoms, phenol having an unsaturated bond between carbon atoms, or a thiol having an unsaturated bond between carbon atoms.

The epoxy compound (B) may be, for example, a glycidyl group-containing ether, a reaction product between a phenolic hydroxy group-containing compound and epichlorohydrin, a reaction product between a phenolic hydroxy group-containing resin and epichlorohydrin, a glycidyl group-containing isocyanurate, an epoxycyclohexyl group-containing compound, an epoxy group-substituted cyclohexyl compound, or a glycidyl ester compound.

The epoxy compound (B) does not have an unsaturated bond that forms a crosslinked structure by, for example, plasma irradiation.

The partial structure (I) and the partial structure (II) are formed by reaction between the epoxy group of the compound (C) and the proton-generating group of the compound (D). Any of the oxygen atoms of $R^1$, $R^3$, $R^5$, $R^{5a}$, $R^{6a}$, $R^{1a}$, and the ester group in the partial structure (1) forms a bond with the carbon atom between $R^7$ and $R^{10}$ or between $R^9$ and $R^{11}$ or the carbon atom in the hydroxycyclohexyl ring in the partial structure (II).

The epoxy compound (C) having an unsaturated bond between carbon atoms is, for example, a glycidyl ester compound having an unsaturated bond between carbon atoms, a reaction product between epichlorohydrin and a phenolic hydroxy group-containing compound having an unsaturated bond between carbon atoms, or a reaction product between epichlorohydrin and a phenolic hydroxy group-containing resin having an unsaturated bond between carbon atoms.

The proton-generating compound (D) is, for example, a phenolic hydroxy group-containing compound, a carboxylic acid-containing compound, an amine-containing compound, a thiol-containing compound, or an imide-containing compound.

The proton-generating compound (D) does not have an unsaturated bond that forms a crosslinked structure by, for example, plasma irradiation.

The unsaturated bond group between carbon atoms of the partial structure (I) and the hydroxyl group of the partial structure (II) may satisfy the relation: 0.01≤(partial structure (II))/(partial structure (I)+partial structure (II))≤0.8 in terms of ratio by mole. When the reaction between the compound (A) and the compound (B) or between the compound (C) and the compound (D) occurs at a ratio by mole of 1:1, the ratio by mole of the unsaturated bond group between carbon atoms of the partial structure (I) to the hydroxyl group of the partial structure (II) becomes 1:1. When the compound having a proton-generating group is any compound that does not have an unsaturated bond between carbon atoms, the amount of the generated hydroxyl group increases. In the present invention, the ratio by mole of the unsaturated bond to the hydroxyl group is 1:4 or less.

The compound (E) may have 1 to 1,000 partial structures (I) and 1 to 1,000 partial structures (II). Thus, the form of the compound (E) ranges from a monomolecular compound to a polymer compound, and the number of the partial structures (I) or (II) contained in each compound falls within the aforementioned range.

Examples of the proton-generating compound (A) having an unsaturated bond between carbon atoms used in the present invention are as follows.

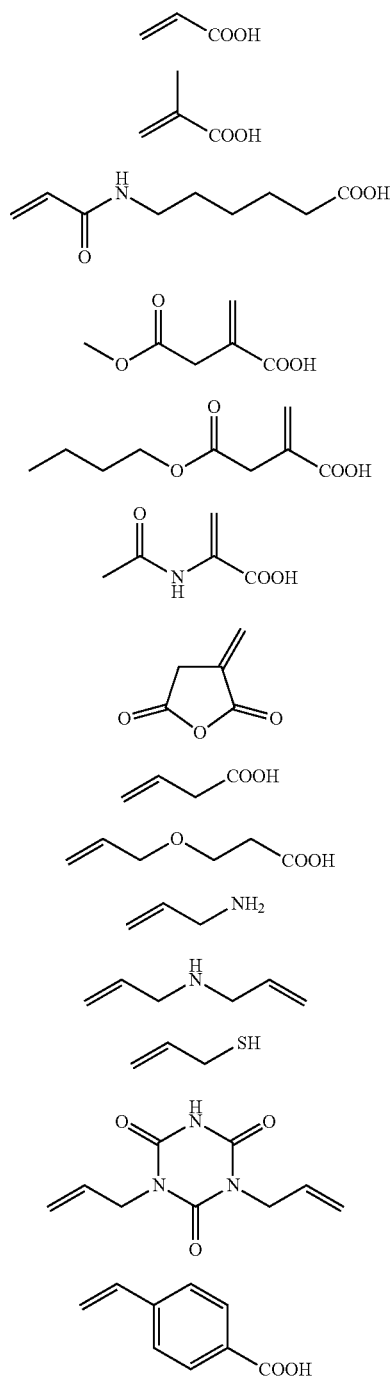

Formula (A-1)
Formula (A-2)
Formula (A-3)
Formula (A-4)
Formula (A-5)
Formula (A-6)
Formula (A-7)
Formula (A-8)
Formula (A-9)
Formula (A-10)
Formula (A-11)
Formula (A-12)
Formula (A-13)
Formula (A-14)

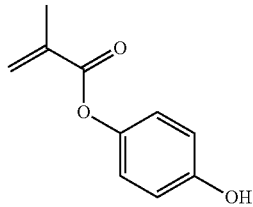

Formula (A-15)

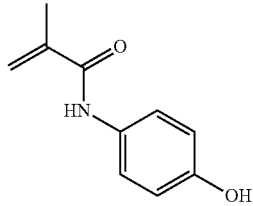

Formula (A-16)

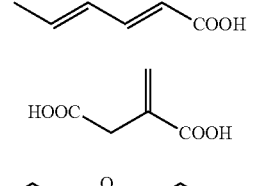

Formula (A-17)

Formula (A-18)

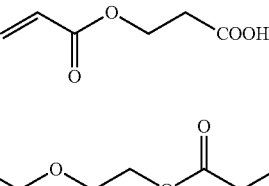

Formula (A-19)

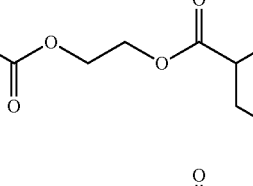

Formula (A-20)

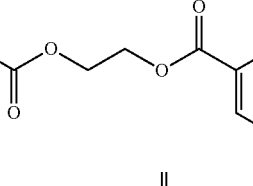

Formula (A-21)

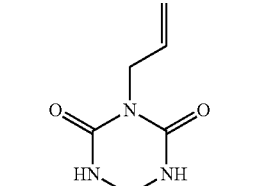

Formula (A-22)

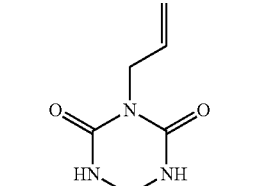

Formula (A-23)

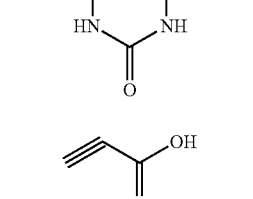

Formula (A-24)

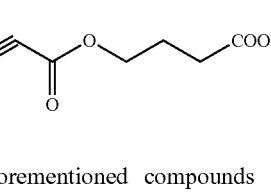

The aforementioned compounds can be obtained as reagents.

Examples of the epoxy compound (B) used in the present invention are as follows.
Formula (B-1)
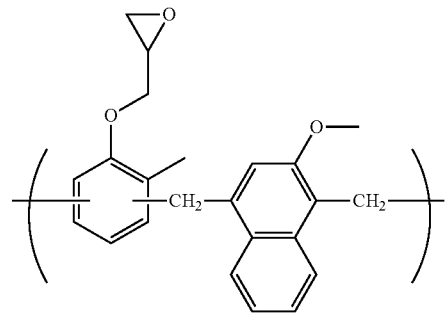
Formula (B-2)
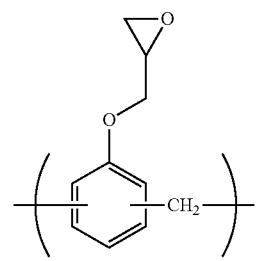
Formula (B-3)
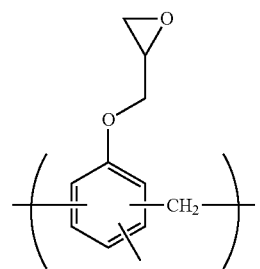
Formula (B-4)
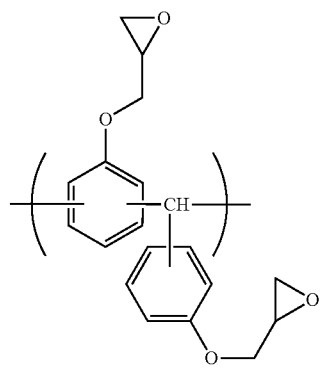
Formula (B-5)
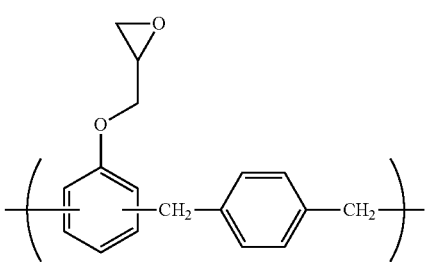
Formula (B-6)
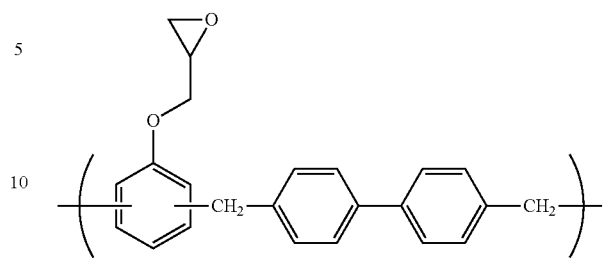
Formula (B-7)
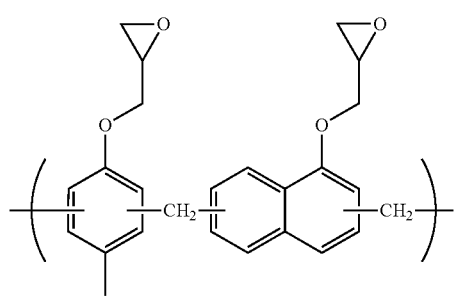
Formula (B-8)
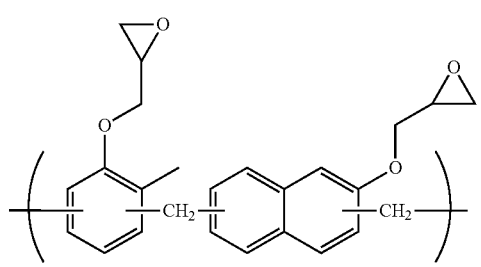
Formula (B-9)
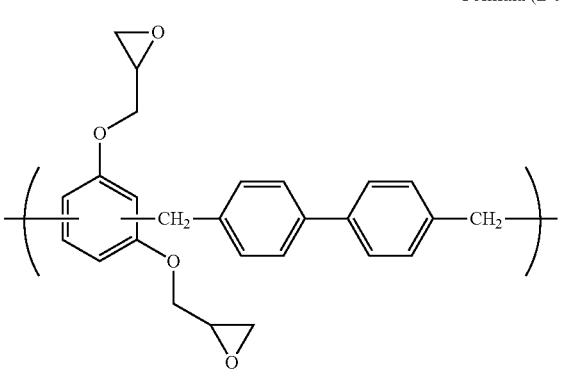
Formula (B-10)
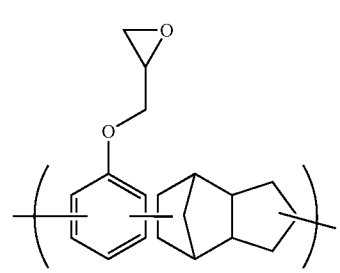

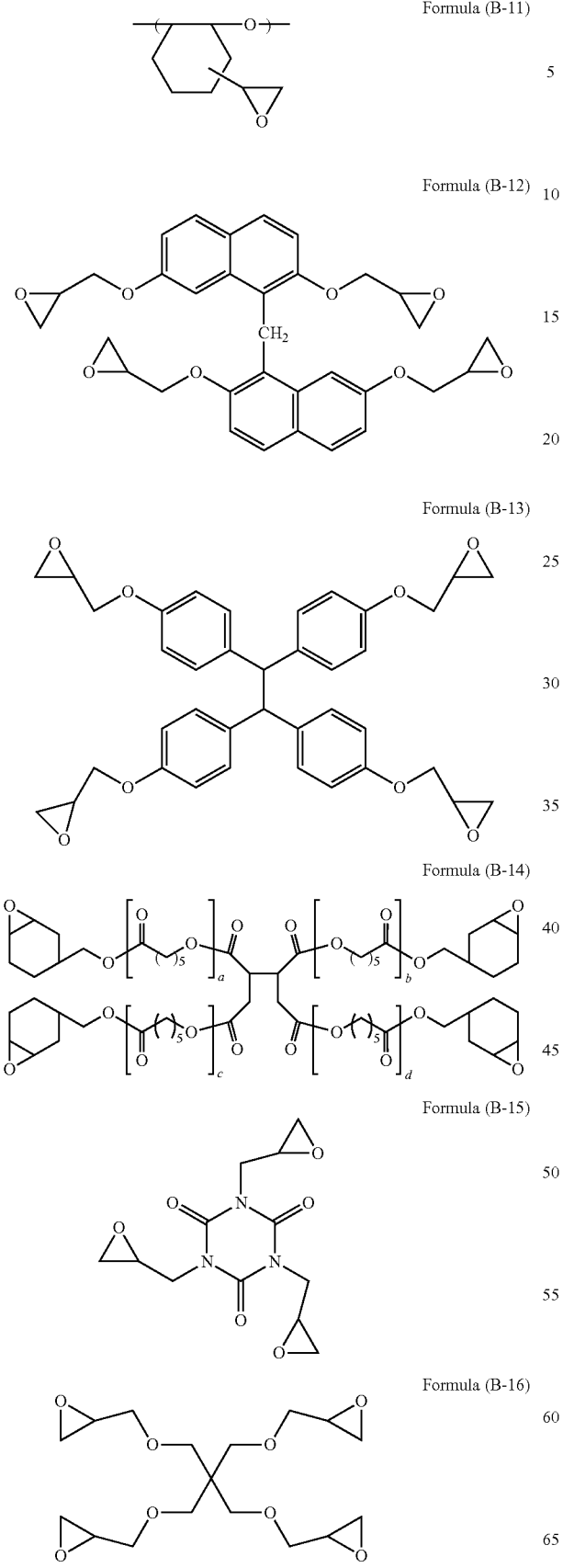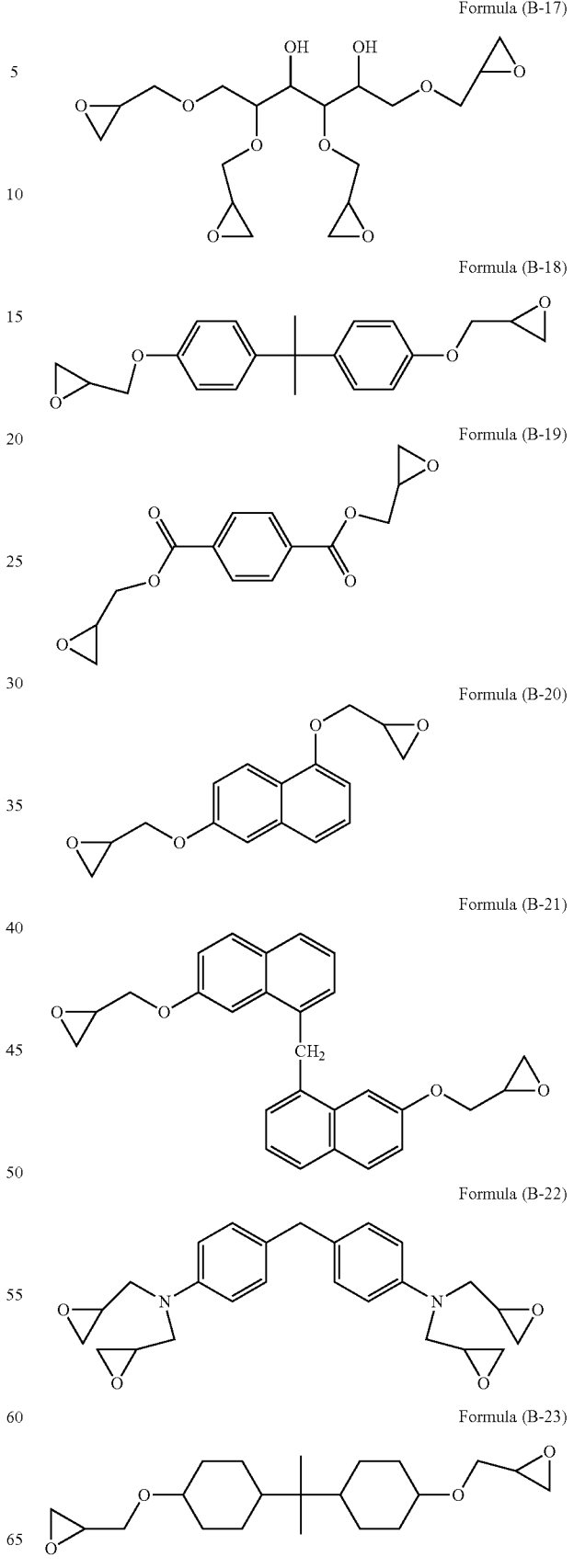

Formula (B-24)

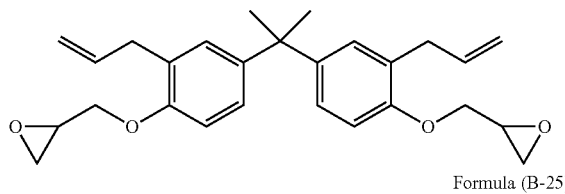

Formula (B-25)

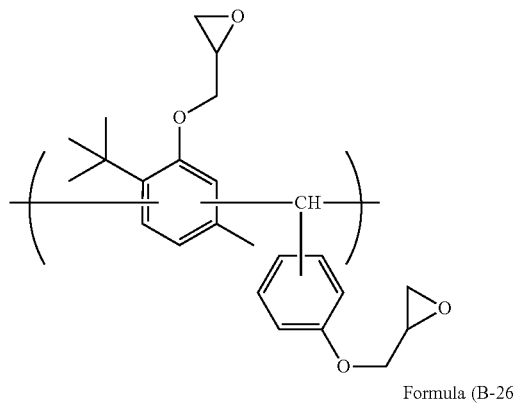

Formula (B-26)

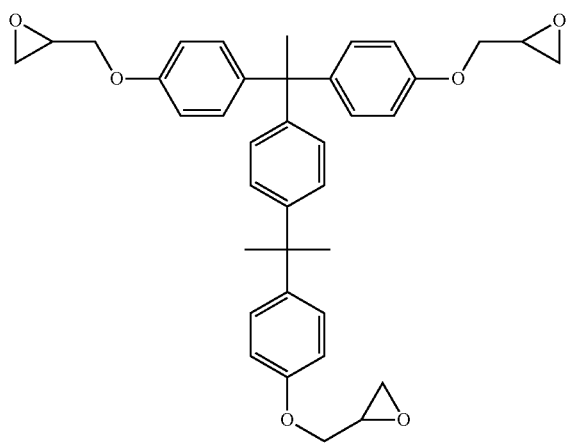

The compound of Formula (B-1) can be obtained as trade name EPICLON HP-5000 available from DIC Corporation.

The compound of Formula (B-2) can be obtained as trade name EPPN-501H available from Nippon Kayaku Co., Ltd.

The compound of Formula (B-3) can be obtained as trade name ECN-1229 available from Asahi Kasei Epoxy Co., Ltd.

The compound of Formula (B-4) can be obtained as trade name EPPN-501H available from Nippon Kayaku Co., Ltd.

The compound of Formula (B-5) can be obtained as trade name NC-2000L available from Nippon Kayaku Co., Ltd.

The compound of Formula (B-6) can be obtained as trade name NC-3000L available from Nippon Kayaku Co., Ltd.

The compound of Formula (B-7) can be obtained as trade name NC-7000L available from Nippon Kayaku Co., Ltd.

The compound of Formula (B-8) can be obtained as trade name NC-7300L available from Nippon Kayaku Co., Ltd.

The compound of Formula (B-9) can be obtained as trade name NC-3500 available from Nippon Kayaku Co., Ltd.

The compound of Formula (B-10) can be obtained as trade name HP-7200L available from DIC Corporation.

The compound of Formula (B-11) can be obtained as trade name EHPE-3150 available from Daicel Corporation.

The compound of Formula (B-12) can be obtained as trade name EPICLON HP-4700 available from DIC Corporation.

The compound of Formula (B-13) can be obtained as trade name TEP-G available from ASAHI YUKIZAI CORPORATION.

The compound of Formula (B-14) can be obtained as trade name Epoleed GT401 available from Daicel Corporation. In Formula (B-14), a, b, c, and d are each 0 or 1, and a+b+c+d is 1.

The compound of Formula (B-15) can be obtained as trade name TEPIC-SS available from Nissan Chemical Corporation.

The compound of Formula (B-16) can be obtained as trade name EX-411 available from Nagase ChemteX Corporation.

The compound of Formula (B-17) can be obtained as trade name EX-521 available from Nagase ChemteX Corporation.

The compound of Formula (B-18) can be obtained as trade name YH-434L available from Nippon Steel & Sumikin Chemical Co., Ltd.

The compound of Formula (B-19) can be obtained as trade name EX-711 available from Nagase ChemteX Corporation.

The compound of Formula (B-20) can be obtained as trade name YD-4032D available from DIC Corporation.

The compound of Formula (B-21) can be obtained as trade name HP-4770 available from DIC Corporation.

The compound of Formula (B-22) can be obtained as trade name YH-434L available from Nippon Steel & Sumikin Chemical Co., Ltd.

The compound of Formula (B-23) can be obtained as a reagent.

The compound of Formula (B-24) can be obtained as trade name RE-810NM available from Nippon Kayaku Co., Ltd.

The compound of Formula (B-25) can be obtained as trade name FAE-2500 available from Nippon Kayaku Co., Ltd.

The compound of Formula (B-26) can be obtained as trade name NC-6000 available from Nippon Kayaku Co., Ltd.

Trade name EPICLON HP-6000 available from DIC Corporation (epoxy value: 244 g/eq.) may also be used.

Examples of the epoxy compound (C) having an unsaturated bond between carbon atoms used in the present invention are as follows.

Formula (C-1)

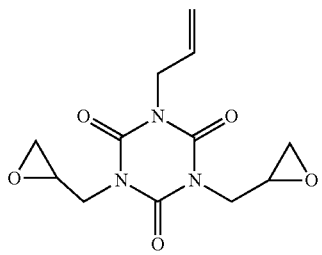

Formula (C-2)

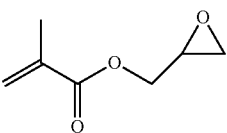

Formula (C-3)

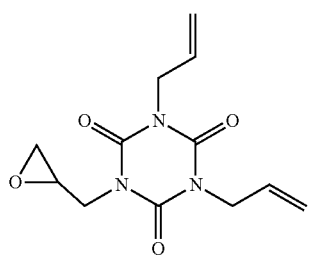

The compound of Formula (C-1) can be obtained as trade name MA-DGIC available from SHIKOKU CHEMICALS CORPORATION.

The compound of Formula (C-3) can be obtained as trade name DA-MGIC available from SHIKOKU CHEMICALS CORPORATION.

The other compound can be obtained as a reagent.

Examples of the proton-generating compound (D) used in the present invention are as follows.

Formula (D-1)
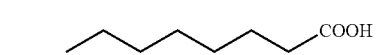

Formula (D-2)
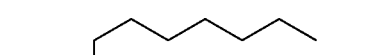

Formula (D-3)
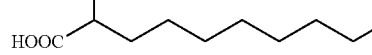

Formula (D-4)
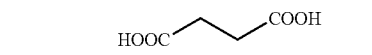

Formula (D-5)
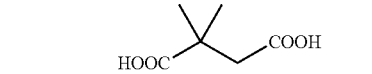

Formula (D-6)

Formula (D-7)

Formula (D-8)
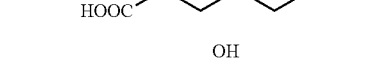

Formula (D-9)

Formula (D-10)
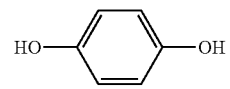

Formula (D-11)
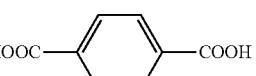

Formula (D-12)
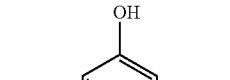

Formula (D-13)
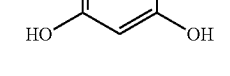

Formula (D-14)
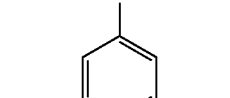

Formula (D-15)
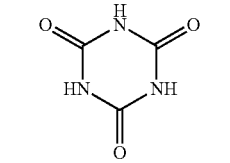

Formula (D-16)
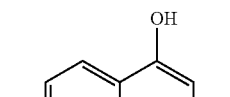

Formula (D-17)
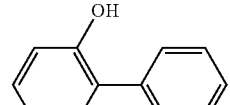

Formula (D-18)
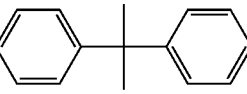

Formula (D-19)
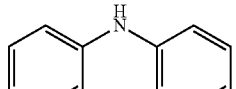

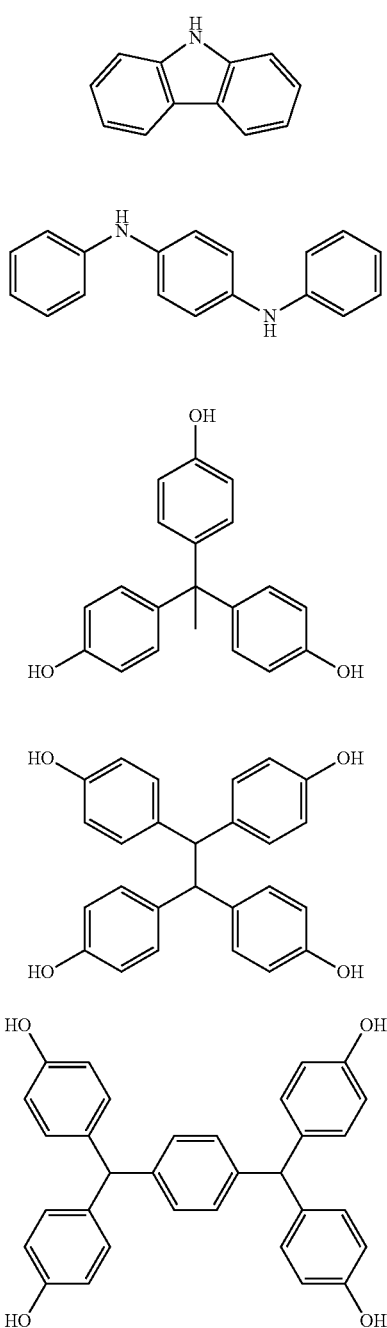
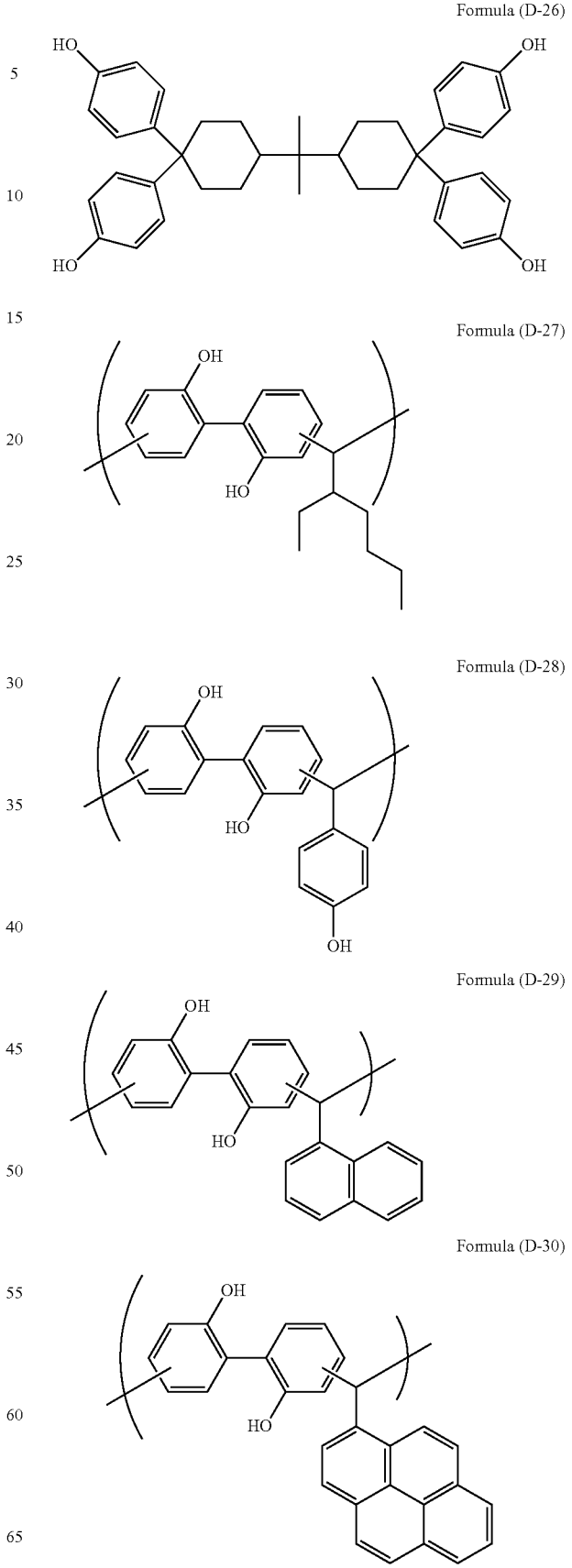

Formula (D-31)
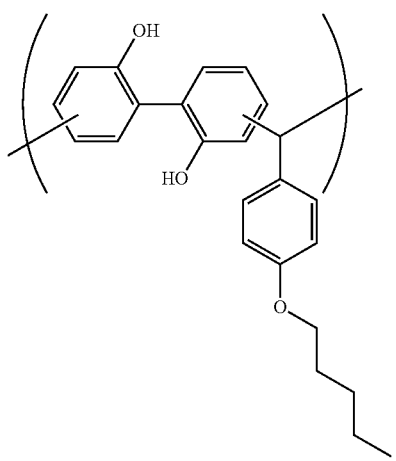

Formula (D-32)
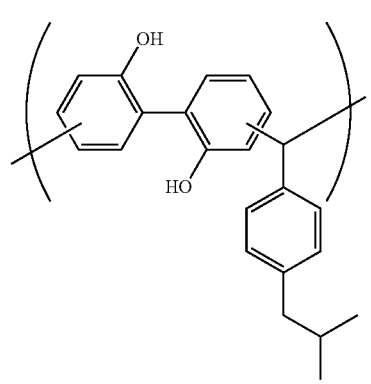

Formula (D-33)
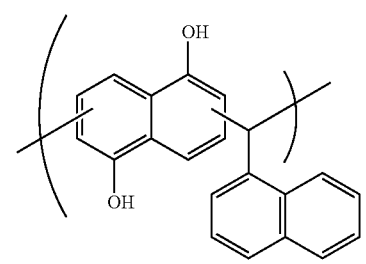

Formula (D-34)
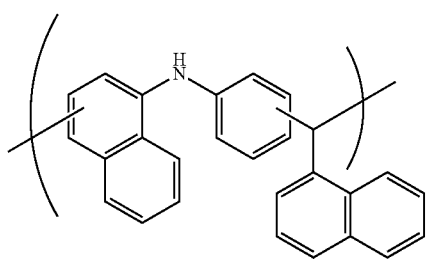

Formula (D-35)
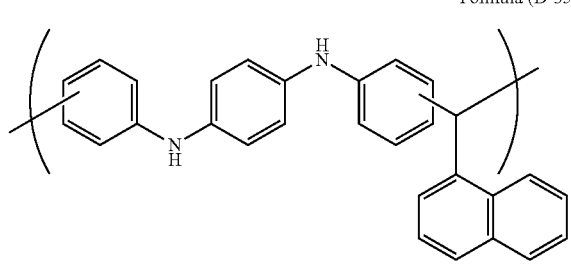

Formula (D-36)
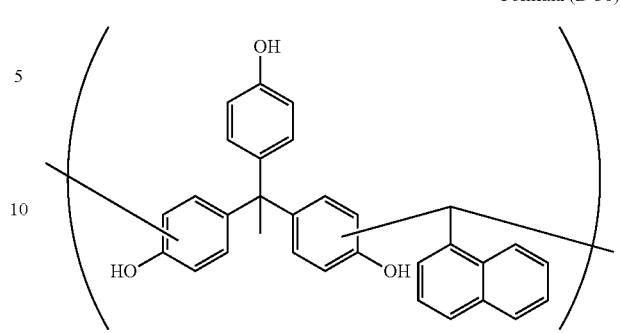

Formula (D-37)
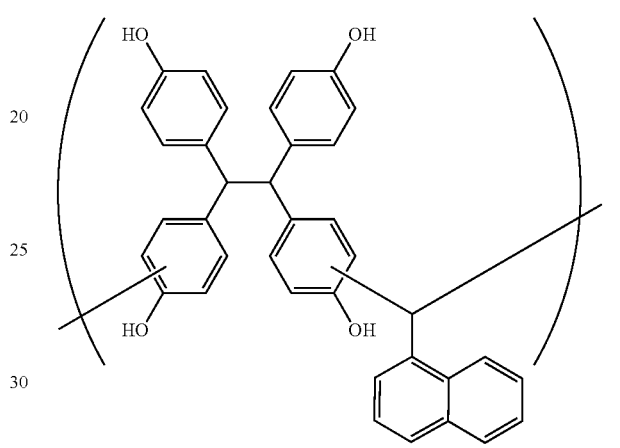

Formula (D-38)
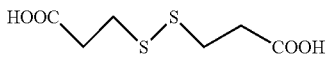

The aforementioned compounds can be obtained as reagents.

The compound of Formula (D-23) can be obtained as trade name TEP-DF available from ASAHI YUKIZAI CORPORATION.

The compound of Formula (D-24) can be obtained as trade name TEP-TPA available from ASAHI YUKIZAI CORPORATION.

The compound of Formula (D-25) can be obtained as trade name TEPC-BIP-A available from ASAHI YUKIZAI CORPORATION.

The compound of Formula (D-26) can be obtained as trade name TEP-BOCP available from ASAHI YUKIZAI CORPORATION.

The compounds of Formulae (D-27) to (D-37) are novolac resins prepared from raw materials available as reagents. The weight average molecular weight of the resultant polymer can be adjusted to fall within a range of 1,000 to 100,000, 1,000 to 50,000, or 1,000 to 10,000.

In the present invention, the compound (E) contains the hydroxyl groups of the partial structures (II). Some of the hydroxyl groups can be reacted with the compound (G) having an unsaturated bond between carbon atoms and being capable of reacting with the hydroxy groups. The reaction between the hydroxyl groups and the compound (G) improves plasma reactivity. This reaction achieves the relation: 0.01≤(partial structure (II))/(partial structure (I)+partial structure (II))≤0.8 in terms of ratio by mole in the compound (E).

The compound (G) may be, for example, an acid halogenide, acid anhydride, isocyanate, or alkyl halide having an unsaturated bond between carbon atoms, or the proton-generating compound (A) having an unsaturated bond between carbon atoms.

Examples of the compound (G) are as follows.

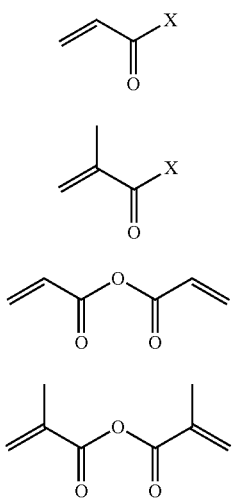

Formula (G-1)

Formula (G-2)

Formula (G-3)

Formula (G-4)

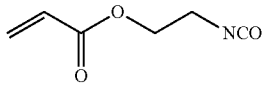

Formula (G-5)

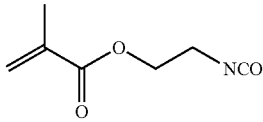

Formula (G-6)

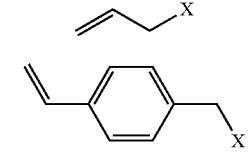

Formula (G-7)

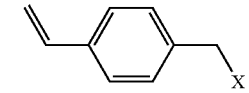

Formula (G-8)

In the aforementioned Formulae, X is a halogen atom, such as fluorine, chlorine, bromine, or iodine. For example, X in Formula (G-1) is preferably a chlorine atom; X in Formula (G-2) is preferably a chlorine atom; X in Formula (G-7) is preferably a bromine atom; and X in Formula (G-8) is preferably a chlorine atom. The aforementioned compounds can be obtained as reagents.

Examples of the compound (E) used in the present invention are as follows.

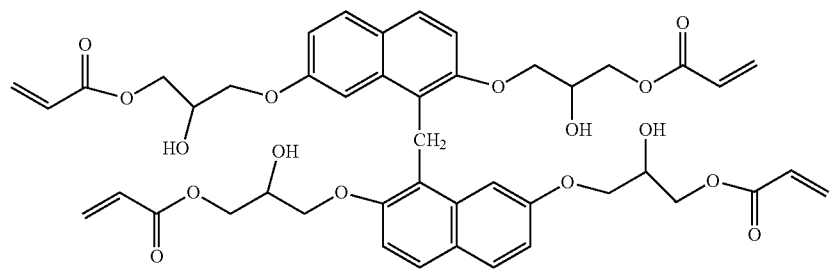

Formula (E-1)

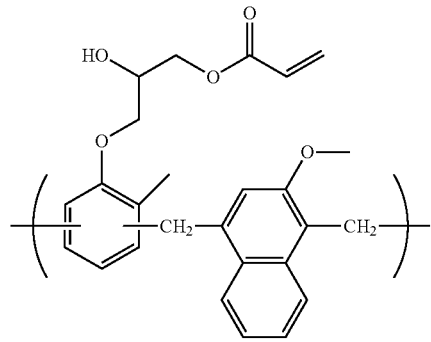

Formula (E-2)

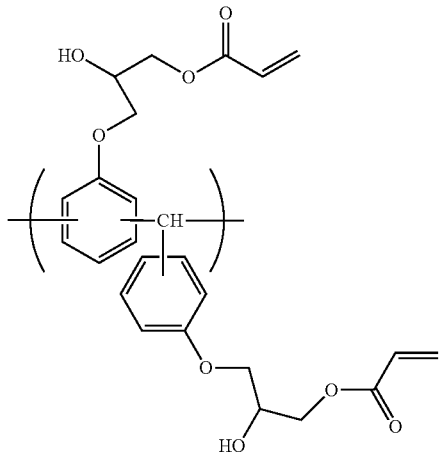

Formula (E-3)

-continued
Formula (E-4)
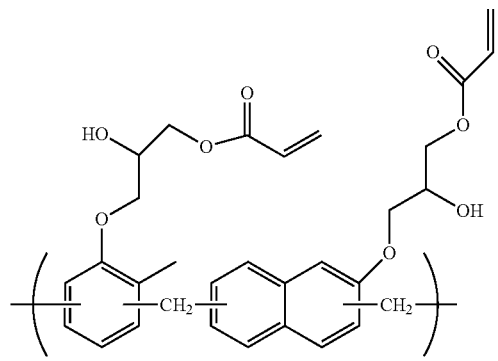
Formula (E-5)
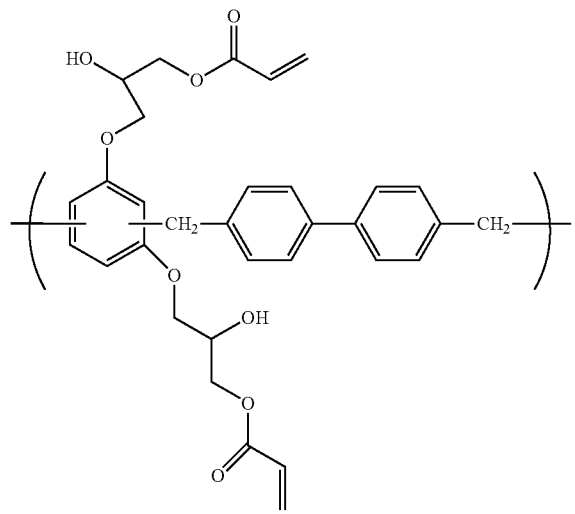
Formula (E-6)
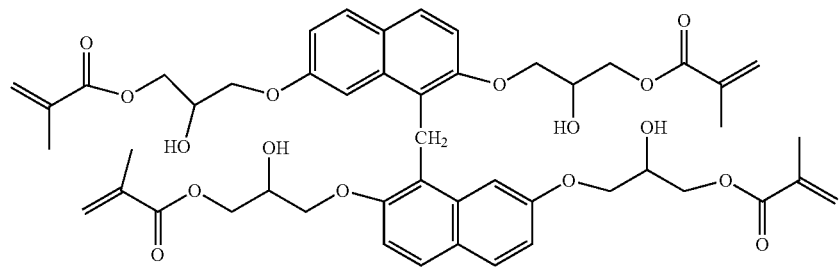
Formula (E-7)
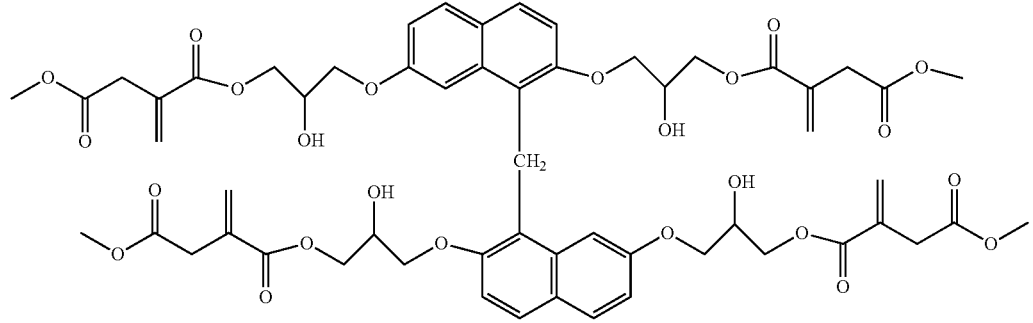
Formula (E-8)
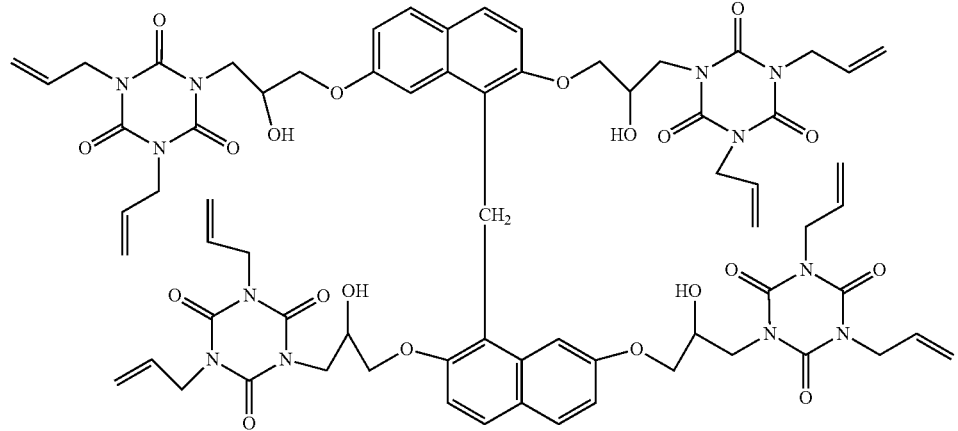

Formula (E-9)
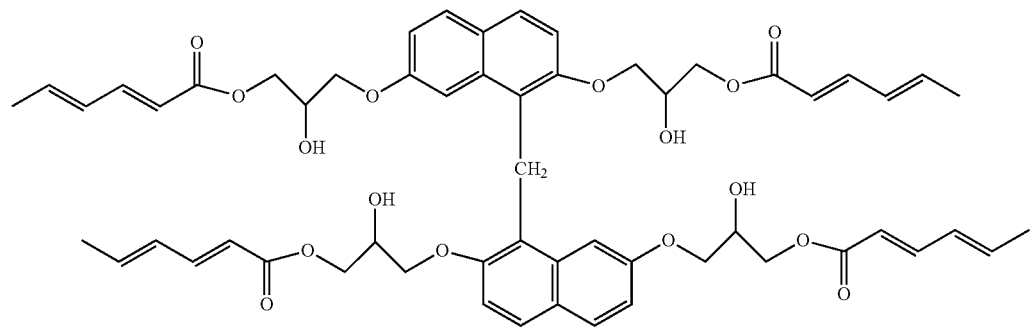
Formula (E-10)
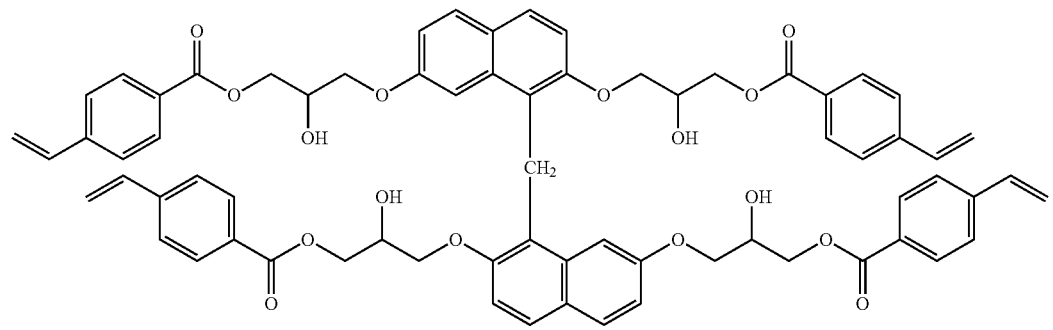
Formula (E-11)
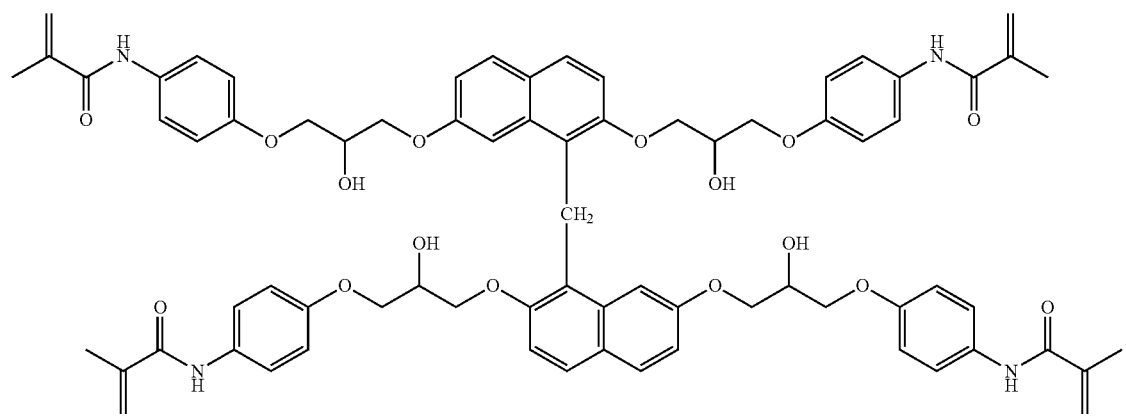

Formula (E-12)
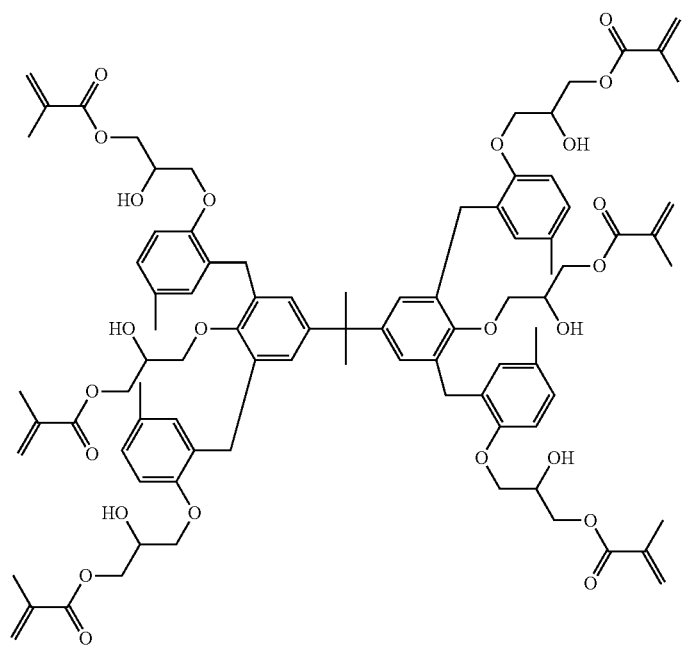
Formula (E-13)
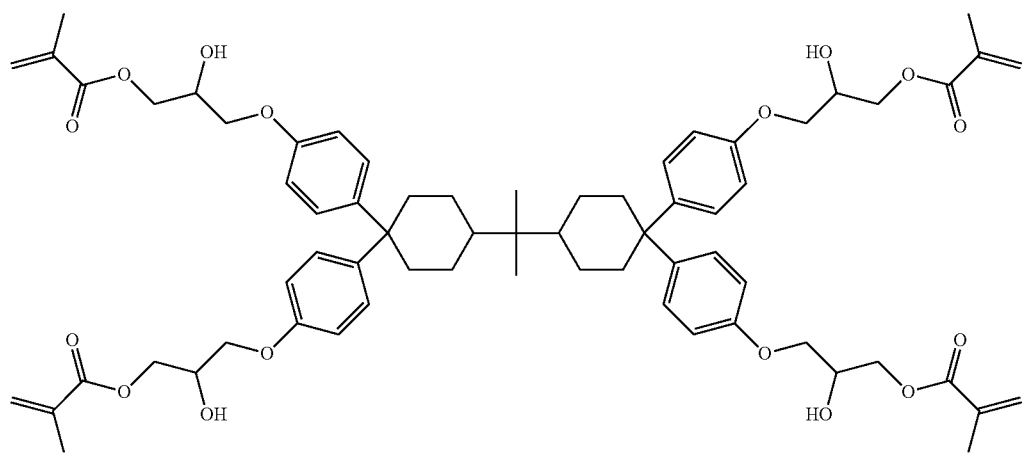

-continued
Formula (E-14)
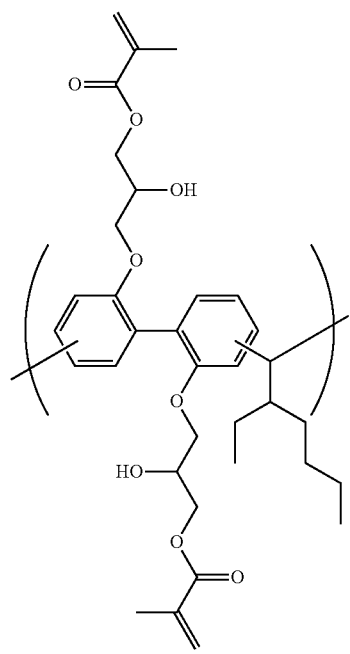
Formula (E-15)
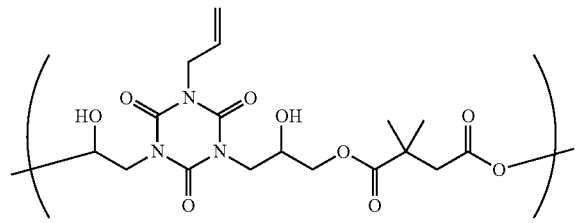
Formula (E-16)
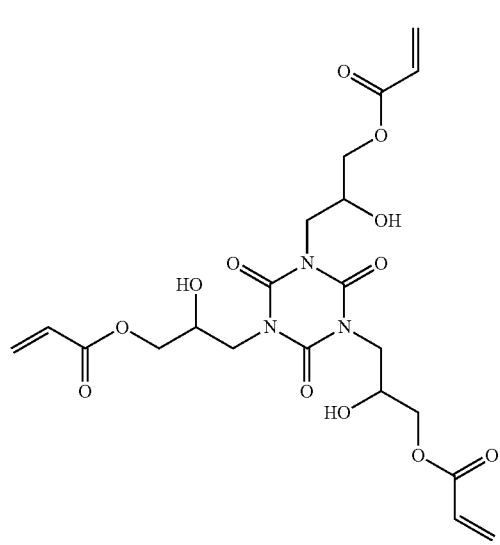
Formula (E-17)
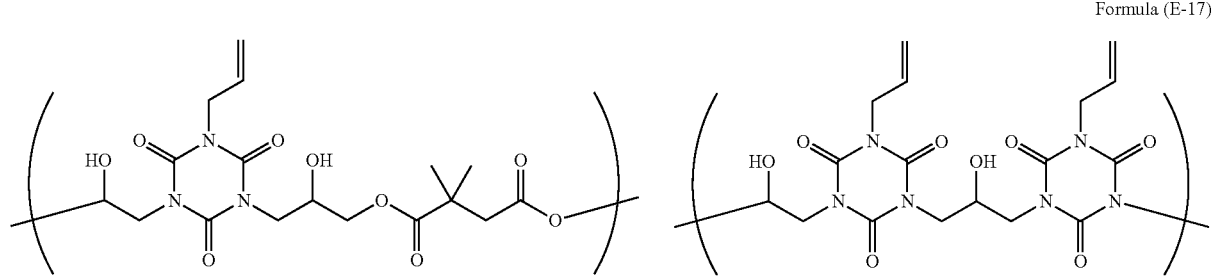
Unit structure (E-17-1)          Unit structure (E-17-2)

In Formula (E-17), the ratio by mole of the unit structure (E-17-1) to the unit structure (E-17-2) is 60:40.
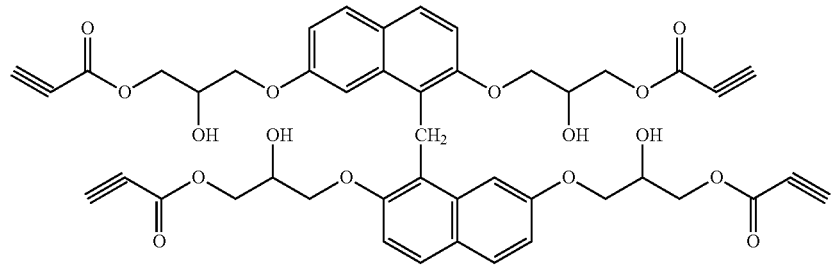
Formula (E-18)
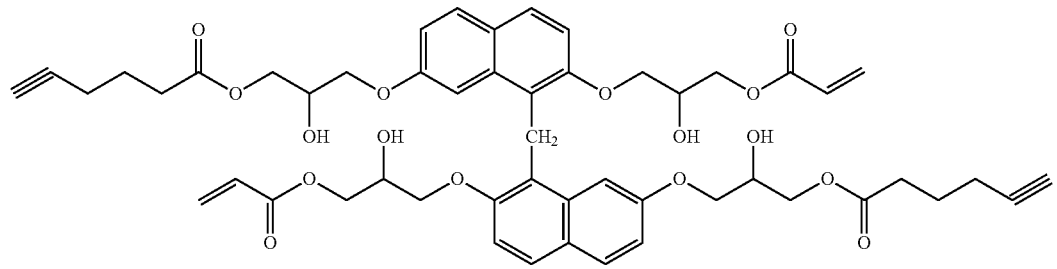
Formula (E-19)
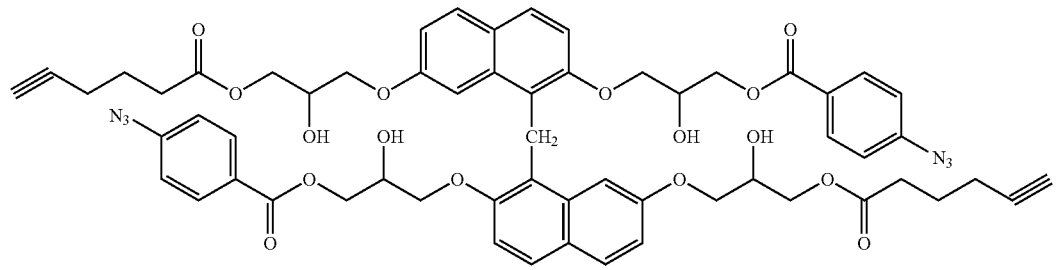
Formula (E-20)
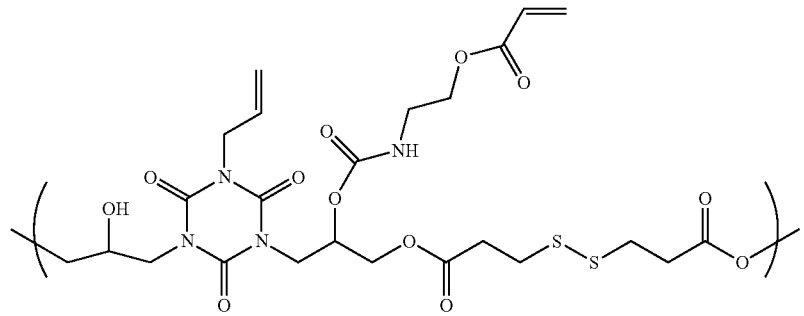
Formula (E-21)
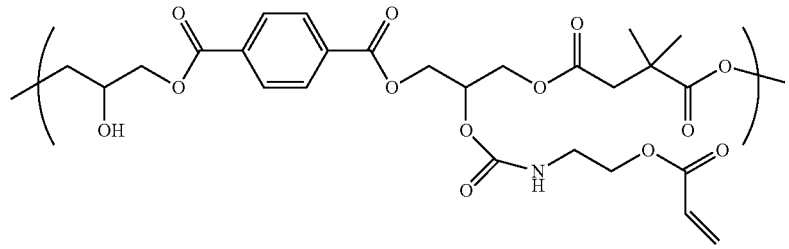
Formula (E-22)

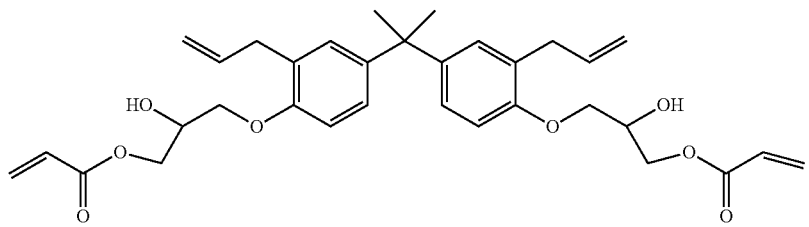

Formula (E-23)

The multi-level substrate coating film-forming composition of the present invention may contain a surfactant. Examples of the surfactant include nonionic surfactants, for example, polyoxyethylene alkyl ethers, such as polyoxyethylene lauryl ether, polyoxyethylene stearyl ether, polyoxyethylene cetyl ether, and polyoxyethylene oleyl ether, polyoxyethylene alkylaryl ethers, such as polyoxyethylene octylphenyl ether and polyoxyethylene nonylphenyl ether, polyoxyethylene-polyoxypropylene block copolymers, sorbitan fatty acid esters, such as sorbitan monolaurate, sorbitan monopalmitate, sorbitan monostearate, sorbitan monooleate, sorbitan trioleate, and sorbitan tristearate, and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-containing surfactants, such as EFTOP [registered trademark] EF301, EF303, and EF352 (available from Mitsubishi Materials Electronic Chemicals Co., Ltd.), MEGAFAC [registered trademark] F171, F173, R30, R-30N, and R-40LM (available from DIC Corporation), Fluorad FC430 and FC431 (available from Sumitomo 3M Limited), Asahi Guard [registered trademark] AG710, and SURFLON [registered trademark] S-382, SC101, SC102, SC103, SC104, SC105, and SC106 (available from Asahi Glass Co., Ltd.); and Organosiloxane Polymer KP341 (available from Shin-Etsu Chemical Co., Ltd.). The composition may contain one species selected from these surfactants, or two or more species selected therefrom in combination. The surfactant content is, for example, 0.01% by mass to 5% by mass relative to the solid content of the multi-level substrate coating film-forming composition of the present invention; i.e., the total amount of all components of the composition, except for the amount of the solvent described below.

Examples of the solvent that can be used for dissolving the compound (E) in the present invention include ethylene glycol monomethyl ether, ethylene glycol monoethyl ether, ethylene glycol monobutyl ether, ethylene glycol monoisopropyl ether, ethylene glycol methyl ether acetate, ethylene glycol ethyl ether acetate, methyl cellosolve acetate, ethyl cellosolve acetate, diethylene glycol, diethylene glycol monomethyl ether, diethylene glycol monoethyl ether, diethylene glycol dimethyl ether, diethylene glycol diethyl ether, diethylene glycol monoethyl ether acetate, propylene glycol, propylene glycol monomethyl ether, propylene glycol monobutyl ether, propylene glycol monomethyl ether acetate, propylene glycol monoethyl ether, propylene glycol monoethyl ether acetate, propylene glycol propyl ether acetate, dipropylene glycol monomethyl ether, dipropylene glycol monoethyl ether, triethylene glycol dimethyl ether, toluene, xylene, styrene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 1-octanol, ethylene glycol, hexylene glycol, trimethylene glycol, 1-methoxy-2-buthanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl isopropyl ketone, diethyl ketone, methyl isobutyl ketone, methyl normal butyl ketone, isopropyl acetate ketone, normal propyl acetate, isobutyl acetate, methanol, ethanol, isopropanol, tert-butanol, allyl alcohol, normal propanol, 2-methyl-2-butanol, isobutanol, normal butanol, 2-methyl-1-butanol, 1-pentanol, 2-methyl-1-pentanol, 2-ethylhexanol, 1-octanol, ethylene glycol, hexylene glycol, trimethylene glycol, 1-methoxy-2-buthanol, diacetone alcohol, furfuryl alcohol, tetrahydrofurfuryl alcohol, propylene glycol, benzyl alcohol, isopropyl ether, 1,4-dioxane, N,N-dimethyl paternmuamide, N,N-dimethylacetamide, N-methylpyrrolidone, 1,3-dimethyl-2-imidazolidinone, dimethyl sulfoxide, and N-cyclohexyl-2-pyrrolidinone. These organic solvents may be used alone or in combination of two or more species.

Next will be described a method for forming a multi-level substrate coating film (planarization film) from the multi-level substrate coating film-forming composition of the present invention. The multi-level substrate coating film-forming composition is applied onto a substrate used for the production of a precise integrated circuit element (e.g., a transparent substrate, such as a silicon/silicon dioxide coating, a glass substrate, or an ITO substrate) by an appropriate coating method using, for example, a spinner or a coater. Thereafter, the composition is baked (heated) and then irradiated with a plasma, to thereby form a coating film. Specifically, a coated substrate is produced by a method including a step (i) of applying the multi-level substrate coating film-forming composition to a multi-level substrate, and a step (ii) of irradiating the composition with a plasma.

When a spinner is used for application of the composition, the application can be performed at a spinner rotation speed of 100 to 5,000 for 10 to 180 seconds.

The aforementioned substrate may have an open area (non-patterned area) and a patterned area of DENCE (dense) and ISO (coarse), and the pattern may have an aspect ratio of 0.1 to 10.

The "non-patterned area" refers to an area where a pattern (e.g., a hole or a trench structure) is absent on the substrate. "DENCE (dense)" refers to an area where patterns are densely present on the substrate, and "ISO (coarse)" refers to an area where interpattern distance is large and patterns are scattered on the substrate. The aspect ratio of a pattern is the ratio of the depth of the pattern to the width of the pattern. The pattern depth is generally several hundreds of nm (e.g., about 100 to 300 nm). DENCE (dense) is an area where patterns of about several tens of nm (e.g., 30 to 80 nm) are densely present at intervals of about 100 nm. ISO (coarse) is an area where patterns of several hundreds of nm (e.g., about 200 to 1,000 nm) are scattered.

The multi-level substrate coating film (planarization film) preferably has a thickness of 0.01 to 3.0 μm. After application of the composition, a step (ia) of heating the composition may be performed at 70 to 400° C. or at 100 to 250° C. for 10 seconds to five minutes or for 30 seconds to two minutes. This heating causes the reflow of the multi-level substrate coating film-forming composition to thereby form a flat multi-level substrate coating film (planarization film).

The plasma irradiation in the step (ii) may be performed with a fluorine-containing gas or a gas mixture of oxygen and an inert gas.

The plasma irradiation in the step (ii) may be performed with an etching gas by using an apparatus used in a dry etching process for a resist pattern.

This plasma irradiation causes a plasma reaction to occur, to thereby form a crosslinked structure, and the resultant multi-level substrate coating film exhibits solvent resistance.

In the thus-formed multi-level substrate coating film (planarization film), the Bias (difference in coating level) is preferably zero between the open area and the patterned area. The planarization can be performed so that the Bias falls within a range of 1 to 50 nm or 1 to 25 nm. The Bias between the open area and the DENCE area is about 15 to 20 nm, and the Bias between the open area and the ISO area is about 1 to 10 nm.

The multi-level substrate coating film (planarization film) produced by the method of the present invention can be coated with a resist film, and the resist film can be exposed to light and developed by a lithography process, to thereby form a resist pattern. The substrate can be processed with the resist pattern. In this case, the multi-level substrate coating film (planarization film) is a resist underlayer film, and the multi-level substrate coating film-forming composition is also a resist underlayer film-forming composition.

A resist can be applied onto the multi-level substrate coating film of the present invention, and the resist can be irradiated with light or electron beams through a predetermined mask, followed by development, rinsing, and drying, to thereby form a good resist pattern. Post exposure bake (PEB) may optionally be performed after the irradiation with light or electron beams. The multi-level substrate coating film at a portion where the resist has been developed and removed in the aforementioned step can be removed by dry etching, to thereby form a desired pattern on the substrate.

The exposure light used for the aforementioned photoresist is actinic rays, such as near-ultraviolet rays, far-ultraviolet rays, or extreme-ultraviolet rays (e.g., EUV, wavelength: 13.5 nm); for example, light having a wavelength of 248 nm (KrF laser beam), 193 nm (ArF laser beam), or 157 nm ($F_2$ laser beam). No particular limitation is imposed on the usable photoirradiation method, so long as the method can generate an acid from a photoacid generator contained in the resist. The exposure dose is 1 to 3,000 mJ/cm$^2$, 10 to 3,000 mJ/cm$^2$, or 10 to 1,000 mJ/cm$^2$.

The aforementioned electron beam resist can be irradiated with electron beams by using, for example, an electron beam irradiation apparatus.

Examples of the developer for the resist having the multi-level substrate coating film formed from the multi-level substrate coating film-forming composition in the present invention include aqueous solutions of alkalis, for example, inorganic alkalis, such as sodium hydroxide, potassium hydroxide, sodium carbonate, sodium silicate, sodium metasilicate, and aqueous ammonia, primary amines, such as ethylamine and n-propylamine, secondary amines, such as diethylamine and di-n-butylamine, tertiary amines, such as triethylamine and methyldiethylamine, alcoholamines, such as dimethylethanolamine and triethanolamine, quaternary ammonium salts, such as tetramethylammonium hydroxide, tetraethylammonium hydroxide, and choline, and cyclic amines, such as pyrrole and piperidine. The developer to be used may be prepared by addition of an appropriate amount of an alcohol (e.g., isopropyl alcohol) or a surfactant (e.g., a nonionic surfactant) to any of the aforementioned aqueous alkali solutions. Among these developers, quaternary ammonium salts are preferred, and tetramethylammonium hydroxide and choline are more preferred.

An organic solvent may be used as the developer. Examples of the organic solvent include methyl acetate, butyl acetate, ethyl acetate, isopropyl acetate, amyl acetate, isoamyl acetate, ethyl methoxyacetate, ethyl ethoxyacetate, propylene glycol monomethyl ether, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Such a developer may further contain, for example, a surfactant. The development is performed under appropriately determined conditions; i.e., a temperature of 5 to 50° C. and a time of 10 to 600 seconds.

In the present invention, a semiconductor device can be produced through a step of forming a multi-level substrate coating film on a semiconductor substrate from the multi-level substrate coating film-forming composition; a step of forming a resist film on the multi-level substrate coating film; a step of irradiating the resist film with light or electron beams, and developing the resist film, to thereby form a resist pattern; a step of etching the multi-level substrate coating film with the resist pattern; and a step of processing the semiconductor substrate with the patterned multi-level substrate coating film.

In the future, the formation of a finer resist pattern will cause a problem in terms of resolution and a problem in that the resist pattern collapses after development, and a decrease in the thickness of a resist will be demanded. Thus, it is difficult to form a resist pattern having a thickness sufficient for processing of a substrate. This requires a process for imparting a mask function, during the substrate processing, not only to the resist pattern, but also to a multi-level substrate coating film that is formed between the resist and the semiconductor substrate to be processed. The multi-level substrate coating film required for such a process is not a conventional resist underlayer film having a high etching rate, but a multi-level substrate coating film having a selection ratio of dry etching rate similar to that of the resist, a multi-level substrate coating film having a smaller selection ratio of dry etching rate than the resist, or a multi-level substrate coating film having a smaller selection ratio of dry etching rate than the semiconductor substrate. Such a multi-level substrate coating film may be provided with an anti-reflective performance; i.e., the coating film may also have the function of a conventional anti-reflective coating.

Meanwhile, a finer resist pattern has started to be formed by using a process for making a resist pattern and a multi-level substrate coating film thinner than the pattern width during the resist development by dry etching of the multi-level substrate coating film. The multi-level substrate coating film required for such a process is not a conventional anti-reflective coating film having a high etching rate, but a multi-level substrate coating film having a selection ratio of dry etching rate similar to that of the resist. Such a multi-level substrate coating film may be provided with an anti-reflective performance; i.e., the coating film may also have the function of a conventional anti-reflective coating.

In the present invention, after formation of the multi-level substrate coating film of the present invention on a substrate, a resist may be applied directly to the multi-level substrate coating film, or if necessary, the resist may be applied after formation of one to several layers of coating material on the multi-level substrate coating film. This process reduces the pattern width of the resist. Thus, even when the resist is thinly applied for prevention of pattern collapse, the substrate can be processed with an appropriately selected etching gas.

Specifically, a semiconductor device can be produced through a step of forming a multi-level substrate coating film on a semiconductor substrate from the multi-level substrate coating film-forming composition; a step of forming, on the multi-level substrate coating film, a hard mask from a coating material containing, for example, a silicon component or a hard mask (e.g., silicon nitride oxide) by vapor deposition; a step of forming a resist film on the hard mask; a step of forming a resist pattern by irradiation with light or electron beams and development; a step of etching the hard mask with the resist pattern by using a halogen-containing gas; a step of etching the multi-level substrate coating film with the patterned hard mask by using an oxygen-containing gas or a hydrogen-containing gas; and a step of processing the semiconductor substrate with the patterned multi-level substrate coating film by using a halogen-containing gas.

Examples of the halogen include fluorine and chlorine. Examples of the halogen-containing gas include tetrafluoromethane ($CF_4$), perfluorocyclobutane ($C_4F_8$), perfluoropropane ($C_3F_8$), trifluoromethane ($CHF_3$), difluoromethane ($CH_2F_2$), nitrogen trifluoride, sulfur hexafluoride, chlorine trifluoride, chlorine, trichloroborane, and dichloroborane.

Examples of the additional gas include an inert gas and carbon monoxide. Examples of the inert gas include nitrogen gas, helium gas, and argon gas.

The compound (E) may have a light-absorbing moiety in the skeleton. Examples of the light-absorbing moiety include, but are not particularly limited to, benzyl group, phenyl group, naphthyl group, anthracenyl group, triazinyl group, cyanuric group, thiadiazolyl group, and thiazolyl group.

In consideration of the effect of the multi-level substrate coating film of the present invention as an anti-reflective coating, since the light-absorbing moiety is incorporated into the skeleton of the film, the film does not diffuse any substance in the photoresist during heating and drying. The multi-level substrate coating film exhibits high anti-reflective effect, since the light-absorbing moiety has high light absorption performance.

The multi-level substrate coating film-forming composition of the present invention has high thermal stability, and thus can prevent pollution of an upper-layer film caused by a decomposed substance during baking. Also, the composition can provide a temperature margin in a baking step.

Depending on process conditions, the multi-level substrate coating film of the present invention can be used as a film having the function of preventing light reflection and the function of preventing the interaction between the substrate and the photoresist or preventing the adverse effect, on the substrate, of a material used for the photoresist or a substance generated during the exposure of the photoresist to light. Examples Synthesis Example 1

Firstly, 34.91 g of propylene glycol monomethyl ether was added to 10.00 g of an epoxy group-containing benzene condensed ring compound (trade name: EPICLON HP-4700, epoxy value: 165 g/eq., available from DIC Corporation, Formula (B-12)), 4.37 g of acrylic acid, 0.56 g of ethyltriphenylphosphonium bromide, and 0.03 g of hydroquinone, and the mixture was stirred in a nitrogen atmosphere under heating at 100° C. for 21 hours. To the resultant mixture were added 15 g of a cation-exchange resin (trade name: DOWEX [registered trademark] 550A, available from MUROMACHI TECHNOS CO., LTD.) and 15 g of an anion-exchange resin (trade name: Amberlite [registered trademark] 15JWET, available from ORGANO CORPORATION), and the mixture was subjected to ion-exchange treatment at room temperature for four hours. The ion-exchange resins were then separated to thereby prepare a solution of compound (E). The resultant compound (E) corresponds to Formula (E-1). The compound was found to have a weight average molecular weight Mw of 1,400 as determined by GPC in terms of polystyrene.

Synthesis Example 2

Firstly, 45.22 g of propylene glycol monomethyl ether was added to 9.00 g of an epoxy group-containing benzene condensed ring compound (trade name: EPICLON HP-4700, epoxy value: 162 g/eq., available from DIC Corporation, Formula (B-12)), 9.84 g of N-(4-hydroxyphenyl)methacrylamide, 1.04 g of ethyltriphenylphosphonium bromide, and 0.02 g of hydroquinone, and the mixture was stirred in a nitrogen atmosphere under heating at 100° C. for 25 hours. To the resultant mixture were added 20 g of a cation-exchange resin (trade name: DOWEX [registered trademark] 550A, available from MUROMACHI TECHNOS CO., LTD.) and 20 g of an anion-exchange resin (trade name: Amberlite [registered trademark] 15JWET, available from ORGANO CORPORATION), and the mixture was subjected to ion-exchange treatment at room temperature for four hours. The ion-exchange resins were then separated to thereby prepare a solution of compound (E). The resultant compound (E) corresponds to Formula (E-1). The compound was found to have a weight average molecular weight Mw of 1,900 as determined by GPC in terms of polystyrene.

Synthesis Example 3

Firstly, 43.89 g of propylene glycol monomethyl ether was added to 14.00 g of an epoxy group-containing benzene condensed ring compound (trade name: EPICLON HP-6000, epoxy value: 239 g/eq., available from DIC Corporation), 4.24 g of acrylic acid, 0.54 g of ethyltriphenylphosphonium bromide, and 0.03 g of hydroquinone, and the mixture was stirred in a nitrogen atmosphere under heating at 100*C for 22 hours. To the resultant mixture were added 19 g of a cation-exchange resin (trade name: DOWEX [registered trademark] 550A, available from MUROMACHI TECHNOS CO., LTD.) and 19 g of an anion-exchange resin (trade name: Amberlite [registered trademark] 15JWET, available from ORGANO CORPORATION), and the mixture was subjected to ion-exchange treatment at room temperature for four hours. The ion-exchange resins were then separated to thereby prepare a solution of compound (E). The resultant compound was found to have a weight average molecular weight Mw of 800 as determined by GPC in terms of polystyrene.

Synthesis Example 4

Firstly, 44.77 g of propylene glycol monomethyl ether was added to 14.00 g of an epoxy group-containing benzene condensed ring compound (trade name: RE-810NM, epoxy value: 221 g/eq., available from Nippon Kayaku Co., Ltd, Formula (B-24)), 4.56 g of acrylic acid, 0.59 g of ethyltriphenylphosphonium bromide, and 0.03 g of hydroquinone, and the mixture was stirred in a nitrogen atmosphere under heating at 100° C. for 22 hours. To the resultant mixture were added 19 g of a cation-exchange resin (trade name: DOWEX [registered trademark] 550A, available from MUROMACHI TECHNOS CO., LTD.) and 19 g of an anion-exchange resin (trade name: Amberlite [registered trademark] 15JWET, available from ORGANO CORPORATION), and the mixture was subjected to ion-exchange treatment at room temperature for four hours. The ion-exchange resins were then separated to thereby prepare a solution of compound (E-23). The resultant compound (E) corresponds to Formula (E-23). The compound was found to have a weight average molecular weight Mw of 900 as determined by GPC in terms of polystyrene.

Comparative Synthesis Example 1

Firstly, 7.57 g of propylene glycol monomethyl ether and 17.67 g of propylene glycol monomethyl ether acetate were added to 5.00 g of an epoxy group-containing aliphatic polyether (trade name: EHPE-3150, epoxy value: 179 g/eq., available from Daicel Corporation, Formula (B-11)), 3.11 g of 9-anthracenecarboxylic acid, 2.09 g of benzoic acid, and 0.62 g of ethyltriphenylphosphonium bromide, and the mixture was refluxed in a nitrogen atmosphere under heating for 13 hours. To the resultant mixture were added 16 g of a cation-exchange resin (trade name: DOWEX [registered trademark] 550A, available from MUROMACHI TECHNOS CO., LTD.) and 16 g of an anion-exchange resin (trade name: Amberlite [registered trademark] 15JWET, available from ORGANO CORPORATION), and the mixture was subjected to ion-exchange treatment at room temperature for four hours. The ion-exchange resins were then separated to thereby prepare a solution of compound (F). The resultant compound (F) corresponds to the following Formula (F-1). The compound was found to have a weight average molecular weight Mw of 4,700 as determined by GPC in terms of polystyrene.

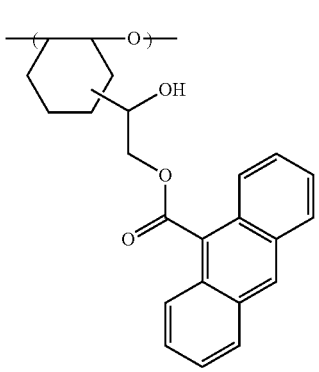

Formula (F-1)

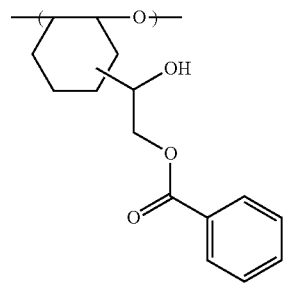

Comparative Synthesis Example 2

Firstly, 47.40 g of propylene glycol monomethyl ether acetate was added to 10.00 g of diphenylamine, 3.11 g of 3-hydroxydiphenylamine, 17.52 g of benzoic acid, 24.63 g of 2-ethylhexylaldehyde, and 0.45 g of methanesulfonic acid, and the mixture was refluxed in a nitrogen atmosphere under heating for two hours. The resultant mixture was added dropwise to a mixed solution of concentrated aqueous ammonia/methanol/water=3/10/10, and the resultant precipitate was dried under reduced pressure at 60° C. The resultant product was dissolved in 63.12 g of propylene glycol monomethyl ether acetate, and then 42 g of a cation-exchange resin (trade name: DOWEX [registered trademark] 550A, available from MUROMACHI TECHNOS CO., LTD.) and 42 g of an anion-exchange resin (trade name: Amberlite [registered trademark] 15JWET, available from ORGANO CORPORATION) were added to the solution. The resultant mixture was subjected to ion-exchange treatment at room temperature for four hours. The ion-exchange resins were then separated to thereby prepare a solution of compound (F). The resultant compound (F) corresponds to the following Formula (F-2). The compound was found to have a weight average molecular weight Mw of 10,700 as determined by GPC in terms of polystyrene.

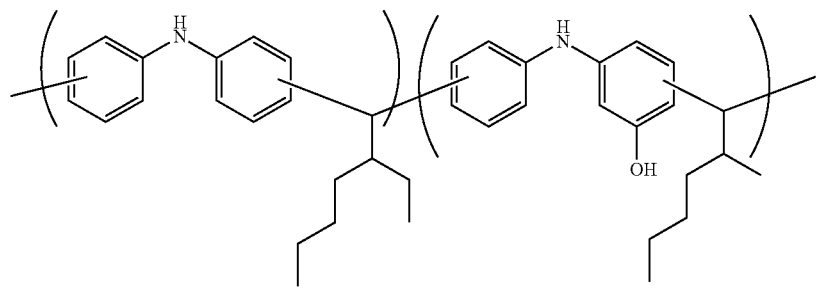

Formula (F-2)

Production Example 1

To 4.19 g of the resin solution prepared in Synthesis Example 1 (solid content: 25.02% by mass) were added 0.001 g of a surfactant (product name: MEGAFAC [trade name] R-40, available from DIC Corporation, fluorine-containing surfactant), 6.62 g of propylene glycol monomethyl ether, and 4.19 g of propylene glycol monomethyl ether acetate, to thereby prepare a solution of a multi-level substrate coating film-forming composition.

Production Example 2

To 6.80 g of the resin solution prepared in Synthesis Example 2 (solid content: 25.71% by mass) were added 0.002 g of a surfactant (product name: MEGAFAC [trade name] R-40, available from DIC Corporation, fluorine-containing surfactant), 11.20 g of propylene glycol monomethyl ether, and 6.98 g of propylene glycol monomethyl ether acetate, to thereby prepare a solution of a multi-level substrate coating film-forming composition.

Production Example 3

To 8.13 g of the resin solution prepared in Synthesis Example 3 (solid content: 25.80% by mass) were added 0.002 g of a surfactant (product name: MEGAFAC [trade name] R-40, available from DIC Corporation, fluorine-containing surfactant), 13.50 g of propylene glycol monomethyl ether, and 8.37 g of propylene glycol monomethyl ether acetate, to thereby prepare a solution of a multi-level substrate coating film-forming composition.

Production Example 4

To 2.72 g of the resin solution prepared in Synthesis Example 2 (solid content: 25.71% by mass) and 3.07 g of the resin solution prepared in Synthesis Example 4 (solid content: 22.76% by mass) were added 0.001 g of a surfactant (product name: MEGAFAC [trade name] R-40, available from DIC Corporation, fluorine-containing surfactant), 8.62 g of propylene glycol monomethyl ether, and 5.58 g of propylene glycol monomethyl ether acetate, to thereby prepare a solution of a multi-level substrate coating film-forming composition.

Comparative Production Example 1

To 6.04 g of the resin solution prepared in Comparative Synthesis Example 1 (solid content: 23.17% by mass) were added 0.001 g of a surfactant (product name: MEGAFAC [trade name] R-40, available from DIC Corporation, fluorine-containing surfactant), 11.63 g of propylene glycol monomethyl ether, and 2.33 g of propylene glycol monomethyl ether acetate, to thereby prepare a solution of a multi-level substrate coating film-forming composition.

Comparative Production Example 2

To 4.63 g of the resin solution prepared in Comparative Synthesis Example 2 (solid content: 30.20% by mass) were added 0.001 g of a surfactant (product name: MEGAFAC [trade name] R-40, available from DIC Corporation, fluorine-containing surfactant), 2.35 g of propylene glycol monomethyl ether, and 13.02 g of propylene glycol monomethyl ether acetate, to thereby prepare a solution of a multi-level substrate coating film-forming composition.

Comparative Production Example 3

To 5.15 g of the resin solution prepared in Comparative Synthesis Example 1 (solid content: 23.17% by mass) were added 0.30 g of tetramethoxymethyl glycoluril (trade name: POWDERLINK [registered trademark] 1174, available from Cytec Industries Japan) serving as a thermal crosslinking agent, 0.01 g of pyridinium p-toluenesulfonate serving as a thermal crosslinking reaction catalyst, 0.001 g of a surfactant (product name: MEGAFAC [trade name] R-40, available from DIC Corporation, fluorine-containing surfactant), 11.76 g of propylene glycol monomethyl ether, and 2.78 g of propylene glycol monomethyl ether acetate, to thereby prepare a solution of a multi-level substrate coating film-forming composition.

[Curability Test]

In Examples 1 to 4, each of the respective multi-level substrate coating film-forming compositions prepared in Production Examples 1 to 4 was applied onto a silicon wafer with a spinner (i.e., spin coating). The composition-applied wafer was heated on a hot plate at 170° C. for one minute to thereby form a coating film (multi-level substrate coating film) having a thickness of 200 nm. The multi-level substrate coating film was dry-etched with a fluorine-containing gas (component: $CF_4$) or an oxygen-containing gas (component: $O_2/N_2$) (i.e., irradiation with an etching gas) by using a plasma dry etching apparatus RIE-10NR (available from SAMCO Inc.) for etch back to achieve a thickness of 100 nm. In order to determine the solvent removability of the multi-level substrate coating film after the dry etching, the multi-level substrate coating film was immersed in a solvent mixture of propylene glycol monomethyl ether and propylene glycol monomethyl ether acetate (7:3) for one minute, followed by spin drying and subsequent baking at 100° C. for one minute. The thicknesses of the multi-level substrate coating film before and after being immersed in the solvent mixture were measured with an optical interference film thickness meter.

In Comparative Examples 1 and 2, each of the respective multi-level substrate coating film-forming compositions prepared in Comparative Production Examples 1 and 2 was applied onto a silicon wafer by spin coating and then heated in the same manner as described above. The resultant coating film was dry-etched back with the plasma dry etching apparatus, and then subjected to the aforementioned solvent removability test.

In Comparative Example 3, the multi-level substrate coating film-forming composition prepared in Comparative Production Example 3 was applied onto a silicon wafer by spin coating and then heated at 215° C. for one minute, to thereby form a coating film having a thickness of 200 nm. The coating film was subjected to the aforementioned solvent removability test without being dry-etched back with the plasma dry etching apparatus. The results of the solvent resistance test are shown in Table 1. "Initial thickness" shown in Table 1 corresponds to the thickness before the solvent removability test.

TABLE 1

| Example | Etching gas | Initial thickness (nm) | Thickness after solvent removability test (nm) |
|---|---|---|---|
| Example 1-A | $CF_4$ | 89.6 | 89.5 |
| Example 1-B | $O_2/N_2$ | 91.0 | 90.5 |
| Example 2-A | $CF_4$ | 97.6 | 97.7 |
| Example 2-B | $O_2/N_2$ | 101.2 | 100.8 |
| Example 3-A | $CF_4$ | 100.8 | 100.8 |
| Example 3-B | $O_2/N_2$ | 105.1 | 104.9 |
| Example 4-A | $CF_4$ | 101.4 | 101.4 |
| Example 4-B | $O_2/N_2$ | 101.4 | 100.7 |
| Comparative Example 1-A | $CF_4$ | 104.6 | 99.6 |
| Comparative Example 1-B | $O_2/N_2$ | 104.1 | 9.7 |
| Comparative Example 2-A | $CF_4$ | 115.3 | 37.8 |
| Comparative Example 2-B | $O_2/N_2$ | 109.5 | 25.4 |
| Comparative Example 3 | — | 204.4 | 204.2 |

As shown in the aforementioned results, the multi-level substrate coating films of Examples 1 to 4 did not exhibit solvent removability (i.e., exhibited solvent resistance) through dry etching with the fluorine-containing gas or the oxygen-containing gas (i.e., irradiation with an etching gas). In contrast, the multi-level substrate coating films of Comparative Examples 1 and 2 did not exhibit solvent resistance through dry etching with the fluorine-containing gas or the oxygen-containing gas (i.e., irradiation with an etching gas). The results indicate that the multi-level substrate coating films of Examples 1 to 4 can form cured films by dry etching (i.e., irradiation with an etching gas). The dry etching apparatus causes irradiation of the multi-level substrate coating film with an etching gas. Thus, the multi-level substrate coating film is probably cured with a plasma component, which is an etching gas component.

In Comparative Example 3, the incorporation of the thermal crosslinking agent resulted in formation of a cured film having solvent resistance without dry etching.

(Planarity Test on Multi-Level Substrate)

For evaluation of multi-level coating property, a multi-level substrate was prepared by vapor deposition of an SiN film (thickness: 5 nm) on an Si substrate (thickness: 200 nm) having a dense patterned area (D-1) (trench width: 50 nm, pitch: 100 nm), a non-patterned open area, a trench area (T-1) (trench width: 230 nm), and a trench area (T-2) (trench width: 800 nm), and the thicknesses of portions of a coating film were compared on the multi-level substrate. In Examples 1 to 4, each of the respective multi-level substrate coating film-forming compositions prepared in Production Examples 1 to 4 was applied onto the aforementioned multi-level substrate so as to achieve a thickness of 400 nm, followed by baking at 170° C. for 60 seconds. The resultant coating film was dry-etched with a fluorine-containing gas (component: $CF_4$) or an oxygen-containing gas (component: $O_2/N_2$) by using a plasma dry etching apparatus for etch back to achieve a thickness of 200 nm. For evaluation of the multi-level coating property of the composition with respect to the multi-level substrate, cross sections of the substrate were observed with a scanning electron microscope (S-4800) available from Hitachi High-Technologies Corporation. The planarity of the substrate was evaluated by measuring the difference between the thickness of the substrate at the open area and that at D-1, T-1, or T-2.

In Comparative Example 3, the multi-level substrate coating film-forming composition prepared in Comparative Production Example 3 was applied onto the aforementioned multi-level substrate in the same manner as described above so as to achieve a thickness of 200 nm, followed by baking at 215° C. for 60 seconds. The results of difference in thickness are shown in Table 2.

TABLE 2

| Sample | Etching gas | Difference in thickness (nm) D-1/OPEN | Difference in thickness (nm) T-1/OPEN | Difference in thickness (nm) T-2/OPEN |
|---|---|---|---|---|
| Example 1-A | $CF_4$ | 6 | 8 | 6 |
| Example 1-B | $O_2/N_2$ | 2 | 0 | 6 |
| Example 2-A | $CF_4$ | 2 | 0 | 2 |
| Example 2-B | $O_2/N_2$ | 4 | 6 | 0 |
| Example 3-A | $CF_4$ | 4 | 4 | 2 |
| Example 3-B | $O_2/N_2$ | 4 | 4 | 2 |
| Example 4-A | $CF_4$ | 0 | 2 | 12 |
| Example 4-B | $O_2/N_2$ | 0 | 0 | 6 |
| Comparative Example 3 | | 77 | 62 | 81 |

As shown in the aforementioned results, the difference between the thickness at the open area and that at D-1, T-1, or T-2 in Examples 1 to 4, in which the cured film was formed by plasma etching back, was smaller as compared with the case in Comparative Example 3, in which the cured film was formed by baking without plasma etching back. Thus, the substrates of Examples 1 to 4, in which the cured film was formed by plasma etching (i.e., irradiation with an etching gas), exhibited better planarity than the substrate of Comparative Example 3, in which the cured film was formed by baking.

INDUSTRIAL APPLICABILITY

The plasma-curable multi-level substrate coating film-forming composition of the present invention can fill a pattern sufficiently and can form a coating film without causing degassing or thermal shrinkage, and thus can be used for forming a coating film having planarity on a substrate.

The invention claimed is:
1. A plasma-curable multi-level substrate coating film-forming composition comprising
a compound (E) and
a solvent (F),
wherein the compound (E) has at least one partial structure selected from partial structures (I) of the following Formulae (1-1) to (1-7):

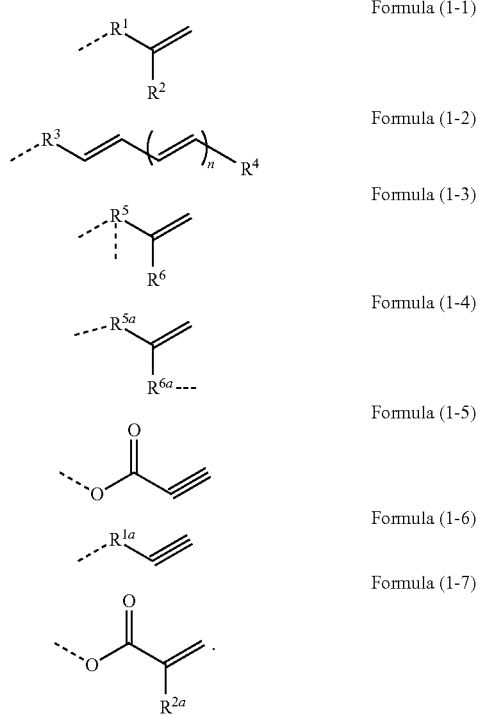

wherein $R^1$, $R^{1a}$, $R^3$, $R^{5a}$, and $R^{6a}$ are each independently a $C_{1-10}$ alkylene group, a $C_{6-40}$ arylene group (the alkylene group and the arylene group are optionally substituted with one or more amide or amino groups), an oxygen atom, a carbonyl group, a sulfur atom, —C(O)—NR$^a$—, —NR$^b$—, or a divalent group composed of any combination of these; $R^5$ is each independently a nitrogen atom, or a trivalent group composed of a combination of a nitrogen atom and at least one group selected from the group consisting of a $C_{1-10}$ alkylene group, a $C_{6-40}$ arylene group (the alkylene group and the arylene group are optionally substituted with one or more amide or amino groups), an oxygen atom, a carbonyl group, a sulfur atom, —C(O)—NR$^a$—, and —NR$^b$—; $R^2$, $R^{2a}$, $R^4$, and $R^6$ are each independently a hydrogen atom, a $C_{1-10}$ alkyl group, or a monovalent group composed of a combination of a hydrogen atom and at least one group selected from the group consisting of a $C_{1-10}$ alkylene group, an oxygen atom, a carbonyl group, —C(O)—NR$^a$—, and —NR$^b$—; $R^a$ is a hydrogen atom or a $C_{1-10}$ alkyl group; $R^b$ is a hydrogen atom, a $C_{1-10}$ alkyl group, or a $C_{1-10}$ alkylcarbonyl group; n is a number of repeating units of 1 to 10; and a dotted line is a chemical bond to the adjacent atom, and
wherein the compound (E) is a reaction product between a proton-generating compound (A) having an unsaturated bond between carbon atoms and an epoxy compound (B) in which a ratio by mole of the proton of the proton-generating compound (A) to the epoxy group of the epoxy compound (B) is 1:1 to 1:1.5.

2. The plasma-curable multi-level substrate coating film-forming composition according to claim 1, wherein $R^{5a}$ and $R^{6a}$ are each a $C_{1-10}$ alkylene group, a $C_{6-40}$ arylene group, an oxygen atom, a carbonyl group, a sulfur atom, or a divalent group composed of any combination of these.

3. The plasma-curable multi-level substrate coating film-forming composition according to claim 1, wherein the proton-generating compound (A) having an unsaturated bond between carbon atoms is a carboxylic acid having an unsaturated bond between carbon atoms, an acid anhydride having an unsaturated bond between carbon atoms, an amine having an unsaturated bond between carbon atoms, an amide having an unsaturated bond between carbon atoms, an isocyanurate having an unsaturated bond between carbon atoms, phenol having an unsaturated bond between carbon atoms, or a thiol having an unsaturated bond between carbon atoms.

4. The plasma-curable multi-level substrate coating film-forming composition according to claim 1, wherein the epoxy compound (B) is a glycidyl group-containing ether, a reaction product between a phenolic hydroxy group-containing compound and epichlorohydrin, a reaction product between a phenolic hydroxy group-containing resin and epichlorohydrin, a glycidyl group-containing isocyanurate, an epoxycyclohexyl group-containing compound, an epoxy group-substituted cyclohexyl compound, or a glycidyl ester compound.

5. The plasma-curable multi-level substrate coating film-forming composition according to claim 1, wherein the plasma is generated through irradiation of a plasma gas used as an etching gas.

6. The plasma-curable multi-level substrate coating film-forming composition according to claim 1, wherein the plasma is a halogen-containing gas plasma, an oxygen gas plasma, or a hydrogen gas plasma.

7. The plasma-curable multi-level substrate coating film-forming composition according to claim 1, wherein the multi-level substrate coating film-forming composition is a resist underlayer film-forming composition used in a lithography process for producing a semiconductor device.

8. A method for producing a coated substrate, the method comprising
a step (i) of applying the plasma-curable multi-level substrate coating film-forming composition according to claim 1 to a multi-level substrate; and
a step (ii) of irradiating the multi-level substrate with a plasma.

9. The method for producing a coated substrate according to claim 8, wherein the method further comprises a step (ia) of heating the plasma-curable multi-level substrate coating film-forming composition at a temperature of 70 to 400° C. for 10 seconds to five minutes after application of the composition in the step (i).

10. The method for producing a coated substrate according to claim 8, wherein the plasma irradiation in the step (ii) is performed with a fluorine-containing gas or a gas mixture of oxygen and an inert gas.

11. The method for producing a coated substrate according to claim 8, wherein the plasma irradiation in the step (ii) is performed with an etching gas by using an apparatus used in a dry etching process.

12. The method for producing a coated substrate according to claim 8, wherein the substrate has an open area (non-patterned area) and a patterned area of DENCE (dense) and ISO (coarse), and the pattern has an aspect ratio of 0.1 to 10.

13. The method for producing a coated substrate according to claim 12, wherein the difference in coating level (Bias) between the open area and the patterned area is 1 to 50 nm.

14. A method for producing a semiconductor device, the method comprising
- a step of forming, on a multi-level semiconductor substrate, an underlayer film from the multi-level substrate coating film-forming composition according to claim 1;
- a step of forming a resist film on the underlayer film;
- a step of irradiating the resist film with light or electron beams, and developing the resist film, to thereby form a resist pattern;
- a step of etching the underlayer film with the resist pattern; and
- a step of processing the semiconductor substrate with the patterned underlayer film.

15. The method for producing a semiconductor device according to claim 14, wherein the multi-level substrate is the substrate.

16. The method for producing a semiconductor device according to claim 14, wherein the step of forming an underlayer film from the multi-level substrate coating film-forming composition is performed.

17. The method for producing a semiconductor device according to claim 14, wherein the underlayer film formed from the multi-level substrate coating film-forming composition has the difference in coating level.

18. A method for producing a semiconductor device, the method comprising
- a step of forming, on a multi-level semiconductor substrate, an underlayer film from the plasma-curable multi-level substrate coating film-forming composition according to claim 1;
- a step of forming a hard mask on the underlayer film;
- a step of forming a resist film on the hard mask;
- a step of irradiating the resist film with light or electron beams, and developing the resist film, to thereby form a resist pattern;
- a step of etching the hard mask with the resist pattern;
- a step of etching the underlayer film with the patterned hard mask; and
- a step of processing the semiconductor substrate with the patterned underlayer film.

19. The method for producing a semiconductor device according to claim 18, wherein the multi-level substrate is the substrate.

20. The method for producing a semiconductor device according to claim 18, wherein the step of forming an underlayer film from the multi-level substrate coating film-forming composition is performed.

21. The method for producing a semiconductor device according to claim 18, wherein the underlayer film formed from the multi-level substrate coating film-forming composition has the difference in coating level.

* * * * *